United States Patent

(12) United States Patent
Telefus et al.

(10) Patent No.: US 12,719,348 B2
(45) Date of Patent: Aug. 25, 2026

(54) AC-TO-DC POWER CONVERSION WITH GROUND REFERENCE TO COMMON NODE OF SOLID-STATE AC SWITCH

(71) Applicant: Amber Semiconductor, Inc., Dublin, CA (US)

(72) Inventors: Mark Telefus, Orinda, CA (US); Nicholas Joseph Layshot, Grass Valley, CA (US); Harry Rodriguez, San Jose, CA (US)

(73) Assignee: Amber Semiconductor, Inc., Dublin, CA (US)

(*) Notice: Subject to any disclaimer, the term of this patent is extended or adjusted under 35 U.S.C. 154(b) by 169 days.

(21) Appl. No.: 18/744,077

(22) Filed: Jun. 14, 2024

(65) Prior Publication Data

US 2024/0421689 A1 Dec. 19, 2024

Related U.S. Application Data

(60) Provisional application No. 63/521,055, filed on Jun. 14, 2023.

(51) Int. Cl.
*H02M 5/293* (2006.01)
*H02H 1/06* (2006.01)
(Continued)

(52) U.S. Cl.
CPC .............. *H02M 1/007* (2021.05); *H02H 1/06* (2013.01); *H02H 3/08* (2013.01); *H02M 1/0009* (2021.05);
(Continued)

(58) Field of Classification Search
CPC .. H02M 1/007; H02M 1/0009; H02M 1/0025; H02M 1/088; H02M 1/32;
(Continued)

(56) References Cited

U.S. PATENT DOCUMENTS

| | | | |
|---|---|---|---|
| 3,638,102 | A | 1/1972 | Pelka |
| 3,777,253 | A | 12/1973 | Callan |

(Continued)

FOREIGN PATENT DOCUMENTS

| | | | |
|---|---|---|---|
| CN | 1246208 | A | 3/2000 |
| CN | 102165555 | A | 8/2011 |

(Continued)

OTHER PUBLICATIONS

K. Yang et al. "Series Arc Fault Detection Algorithm Based on Autoregressive Bispecturm Analysis," Algorithms, vol. 8, Oct. 16, 2015, pp. 929-950.

(Continued)

*Primary Examiner* — Thienvu V Tran
*Assistant Examiner* — Shahzeb K Ahmad
(74) *Attorney, Agent, or Firm* — Ryan, Mason & Lewis, LLP

(57) ABSTRACT

Techniques are provided to utilize a common node of a solid-state AC switch as a DC ground reference node for DC power generation and control circuitry of an intelligent electrical device (e.g., intelligent dimmer switch, intelligent circuit breaker, etc.). For example, a device comprises a solid-state AC switch, and a power converter circuit. The solid-state AC switch comprises a first solid-state switch and a second solid-state switch which are coupled back-to-back to common node of the solid-state AC switch. The power converter circuit is coupled to the common node of the solid-state AC switch and is configured to convert an AC voltage to a DC voltage. The common node of the solid-state AC switch is utilized as a DC ground node of the power converter circuit, and the DC voltage output from the power converter circuit is ground referenced to the common node of the solid-state AC switch.

20 Claims, 10 Drawing Sheets

(51) Int. Cl.

| | |
|---|---|
| ***H02H 3/08*** | (2006.01) |
| ***H02M 1/00*** | (2006.01) |
| ***H02M 1/088*** | (2006.01) |
| ***H02M 1/32*** | (2007.01) |
| ***H02M 7/217*** | (2006.01) |
| ***H03K 17/082*** | (2006.01) |
| ***H03K 17/13*** | (2006.01) |
| ***H03K 17/687*** | (2006.01) |

(52) U.S. Cl.
CPC ......... *H02M 1/0025* (2021.05); *H02M 1/088* (2013.01); *H02M 1/32* (2013.01); *H02M 7/217* (2013.01); *H03K 17/0822* (2013.01); *H03K 17/133* (2013.01); *H03K 17/6874* (2013.01); *H02M 5/293* (2013.01); *H03K 2217/0009* (2013.01)

(58) Field of Classification Search
CPC .... H02M 1/36; H02M 1/0012; H02M 1/0006; H02M 7/217; H02M 7/32; H02M 7/30; H02M 7/40; H02M 7/155; H02M 7/10; H02M 7/06; H03K 17/0822; H03K 17/133; H03K 17/6874; H03K 2217/0009; H02H 3/08; H02H 1/06
See application file for complete search history.

(56) References Cited

U.S. PATENT DOCUMENTS 4,074,345 A 2/1978 Ackermann
4,127,895 A 11/1978 Krueger
4,245,148 A 1/1981 Gisske et al.
4,245,184 A 1/1981 Billings et al.
4,245,185 A 1/1981 Mitchell et al.
4,257,081 A 3/1981 Sauer et al.
4,466,071 A 8/1984 Russell, Jr.
4,487,458 A 12/1984 Janutka
4,581,540 A 4/1986 Guajardo
4,631,625 A 12/1986 Alexander et al.
4,636,907 A 1/1987 Howell
4,641,233 A 2/1987 Roy
4,649,302 A 3/1987 Damiano et al.
4,653,084 A 3/1987 Ahuja
4,682,061 A 7/1987 Donovan
4,685,046 A 8/1987 Sanders
4,709,296 A 11/1987 Hung et al.
4,760,293 A 7/1988 Hebenstreit
4,766,281 A 8/1988 Buhler
4,806,844 A 2/1989 Claydon et al.
4,812,995 A 3/1989 Girgis et al.
4,823,225 A 4/1989 Foster et al.
4,888,504 A 12/1989 Kinzer
4,945,345 A 7/1990 Proctor et al.
5,041,960 A 8/1991 Tseruel
5,118,993 A 6/1992 Yang
5,121,282 A 6/1992 White
5,276,737 A 1/1994 Micali
5,298,817 A * 3/1994 Banak .................. H03K 17/785
327/434
5,307,257 A 4/1994 Fukushima
5,371,646 A 12/1994 Biegelmeier
5,410,745 A 4/1995 Friesen et al.
5,559,656 A 9/1996 Chokhawala
5,646,514 A 7/1997 Tsunetsugu
5,654,880 A 8/1997 Brkovic et al.
5,731,732 A 3/1998 Williams
5,793,596 A 8/1998 Jordan et al.
5,796,274 A 8/1998 Willis et al.
5,801,933 A 9/1998 Ravid
5,844,759 A 12/1998 Hirsh et al.
5,859,756 A 1/1999 Pressman et al.
5,870,009 A 2/1999 Serpinet et al.
5,933,305 A 8/1999 Schmalz et al.
6,081,123 A 6/2000 Kasbarian et al.
6,111,494 A 8/2000 Fischer et al.
6,111,733 A 8/2000 Neiger et al.
6,115,267 A 9/2000 Herbert
6,141,197 A 10/2000 Kim et al.
6,160,689 A 12/2000 Stolzenberg
6,167,329 A 12/2000 Engel et al.
6,169,391 B1 1/2001 Lei
6,188,203 B1 2/2001 Rice et al.
6,282,109 B1 8/2001 Fraidlin et al.
6,300,748 B1 10/2001 Miller
6,369,554 B1 4/2002 Aram
6,437,955 B1 8/2002 Duffy et al.
6,483,290 B1 11/2002 Hemminger et al.
6,515,434 B1 2/2003 Biebl
6,538,906 B1 3/2003 Ke et al.
6,788,512 B2 9/2004 Vicente et al.
6,807,035 B1 10/2004 Baldwin et al.
6,813,720 B2 11/2004 Leblanc
6,839,208 B2 1/2005 Macbeth et al.
6,843,680 B2 1/2005 Gorman
6,906,476 B1 6/2005 Beatenbough et al.
6,984,988 B2 1/2006 Yamamoto
7,045,723 B1 5/2006 Projkovski
7,053,626 B2 5/2006 Monter et al.
7,110,225 B1 9/2006 Hick
7,136,265 B2 11/2006 Wong et al.
7,164,238 B2 1/2007 Kazanov et al.
7,292,419 B1 11/2007 Nemir
7,297,603 B2 11/2007 Robb et al.
7,304,828 B1 12/2007 Shvartsman
D558,683 S 1/2008 Pape et al.
7,319,574 B2 1/2008 Engel
D568,253 S 5/2008 Gorman
7,367,121 B1 5/2008 Gorman
7,586,285 B2 9/2009 Gunji
7,595,680 B2 9/2009 Morita et al.
7,596,004 B2 9/2009 Grbovic
7,633,727 B2 12/2009 Zhou et al.
7,643,256 B2 1/2010 Wright et al.
7,693,670 B2 4/2010 Durling et al.
7,715,216 B2 5/2010 Liu et al.
7,729,147 B1 6/2010 Wong et al.
7,731,403 B2 6/2010 Lynam et al.
7,746,677 B2 6/2010 Unkrich
7,821,023 B2 10/2010 Yuan et al.
D638,355 S 5/2011 Chen
7,936,279 B2 5/2011 Tang et al.
7,948,719 B2 5/2011 Xu
8,124,888 B2 2/2012 Etemad-Moghadam et al.
8,174,804 B2 5/2012 Fasano
8,184,419 B2 5/2012 Peng
8,256,675 B2 9/2012 Baglin et al.
8,295,950 B1 10/2012 Wordsworth et al.
8,334,663 B2 * 12/2012 Carmen .................. H02M 1/08
315/307
8,374,729 B2 2/2013 Chapel et al.
8,463,453 B2 6/2013 Parsons, Jr.
8,482,885 B2 7/2013 Billingsley et al.
8,560,134 B1 10/2013 Lee
8,649,883 B2 2/2014 Lu et al.
8,664,886 B2 3/2014 Ostrovsky
8,717,720 B2 5/2014 DeBoer
8,718,830 B2 5/2014 Smith
8,737,030 B2 5/2014 Valdes
8,781,637 B2 7/2014 Eaves
8,817,441 B2 8/2014 Callanan
8,890,371 B2 11/2014 Gotou
D720,295 S 12/2014 Dodal et al.
8,947,838 B2 2/2015 Yamai et al.
9,054,587 B2 6/2015 Neyman
9,055,641 B2 6/2015 Shteynberg et al.
9,237,617 B1 1/2016 Xiong
9,287,792 B2 3/2016 Telefus et al.
9,325,516 B2 4/2016 Pera et al.
9,366,702 B2 6/2016 Steele et al.
9,439,318 B2 9/2016 Chen
9,443,845 B1 9/2016 Stafanov et al.
9,502,832 B1 11/2016 Ullahkhan et al.

(56) References Cited

U.S. PATENT DOCUMENTS 9,509,083 B2 11/2016 Yang
9,515,560 B1 12/2016 Telefus et al.
9,577,420 B2 2/2017 Ostrovsky et al.
9,608,430 B2 3/2017 Duan et al.
9,621,053 B1 4/2017 Telefus
9,729,066 B1 8/2017 Lu et al.
9,755,630 B2 9/2017 Urciuoli
9,759,758 B2 9/2017 Ostrovsky et al.
9,774,182 B2 9/2017 Phillips
9,836,243 B1 12/2017 Chanler et al.
9,883,554 B2 1/2018 Lynch
D814,424 S 4/2018 DeCosta
9,965,007 B2 5/2018 Amelio et al.
9,978,553 B2 5/2018 Tomimbang et al.
9,991,633 B2 6/2018 Robinet
10,072,942 B2 9/2018 Wootton et al.
10,076,006 B2 9/2018 Kahlman et al.
10,101,716 B2 10/2018 Kim
10,135,235 B2 11/2018 Cui et al.
10,187,944 B2 1/2019 MacAdam et al.
10,243,350 B2 3/2019 Pan et al.
10,469,077 B2 11/2019 Telefus et al.
10,548,188 B2 1/2020 Cheng et al.
D879,056 S 3/2020 Telefus
D881,144 S 4/2020 Telefus
10,615,713 B2 4/2020 Telefus et al.
10,756,662 B2 8/2020 Steiner et al.
10,812,072 B2 10/2020 Telefus et al.
10,812,282 B2 10/2020 Telefus et al.
10,819,336 B2 10/2020 Telefus et al.
10,834,792 B2 11/2020 Telefus et al.
10,931,473 B2 2/2021 Telefus et al.
10,985,548 B2 4/2021 Telefus
10,992,236 B2 4/2021 Telefus et al.
11,050,236 B2 6/2021 Telefus et al.
11,056,981 B2 7/2021 Telefus
11,064,586 B2 7/2021 Telefus et al.
11,114,947 B2 9/2021 Telefus et al.
11,170,964 B2 11/2021 Telefus et al.
11,201,460 B2 12/2021 Oishi et al.
11,245,339 B2 2/2022 Telefus et al.
11,336,199 B2 5/2022 Telefus et al.
11,342,151 B2 5/2022 Telefus et al.
11,342,735 B2 5/2022 Telefus et al.
11,348,752 B2 5/2022 Telefus et al.
11,349,296 B2 5/2022 Telefus
11,349,297 B2 5/2022 Telefus et al.
11,363,690 B2 6/2022 Telefus et al.
11,373,831 B2 6/2022 Telefus et al.
11,422,520 B2 8/2022 Telefus et al.
11,551,899 B2 1/2023 Telefus et al.
11,581,725 B2 2/2023 Telefus
11,670,946 B2 6/2023 Telefus et al.
11,671,029 B2 6/2023 Telefus
11,682,891 B2 6/2023 Telefus et al.
11,721,508 B2 8/2023 Telefus et al.
11,764,565 B2 9/2023 Telefus
11,791,616 B2 10/2023 Telefus
11,870,364 B2 1/2024 Telefus
2002/0109487 A1 8/2002 Telefus et al.
2003/0052544 A1 3/2003 Yamamoto et al.
2003/0063420 A1 4/2003 Pahl et al.
2003/0125885 A1 7/2003 Dougherty et al.
2003/0151865 A1 8/2003 Maio
2004/0032756 A1 2/2004 Van Den Bossche
2004/0201279 A1 10/2004 Templeton
2004/0251884 A1 12/2004 Steffie et al.
2005/0128657 A1 6/2005 Covault
2005/0162139 A1 7/2005 Hirst
2005/0185353 A1 8/2005 Rasmussen et al.
2005/0286184 A1 12/2005 Campolo
2006/0227469 A1 10/2006 Parker et al.
2006/0285366 A1 12/2006 Radecker et al.
2007/0008747 A1 1/2007 Soldano et al.
2007/0018506 A1 1/2007 Paik et al.
2007/0159745 A1 7/2007 Berberich et al.
2007/0188025 A1 8/2007 Keagy et al.
2007/0217237 A1 9/2007 Palestrina
2007/0236152 A1 10/2007 Davis et al.
2008/0006607 A1 1/2008 Boeder et al.
2008/0072080 A1 3/2008 Chapuis et al.
2008/0136581 A1 6/2008 Heilman et al.
2008/0151444 A1 6/2008 Upton
2008/0174922 A1 7/2008 Kimbrough
2008/0180866 A1 7/2008 Wong
2008/0197699 A1 8/2008 Yu et al.
2008/0204950 A1 8/2008 Zhou et al.
2008/0234879 A1 9/2008 Fuller et al.
2008/0238488 A1 10/2008 Comisky et al.
2008/0246451 A1 10/2008 Dobbins et al.
2008/0253153 A1 10/2008 Wu et al.
2009/0034139 A1 2/2009 Martin
2009/0067201 A1 3/2009 Cai
2009/0168273 A1 7/2009 Yu et al.
2009/0213629 A1 8/2009 Liu et al.
2009/0284385 A1 11/2009 Tang et al.
2009/0296432 A1 12/2009 Chapuis
2010/0013307 A1 1/2010 Heineman et al.
2010/0091418 A1 4/2010 Xu
2010/0156369 A1 6/2010 Kularatna et al.
2010/0188054 A1 7/2010 Asakura et al.
2010/0191487 A1 7/2010 Rada et al.
2010/0231135 A1 9/2010 Hum et al.
2010/0231373 A1 9/2010 Romp
2010/0244730 A1 9/2010 Nerone
2010/0261373 A1 10/2010 Roneker
2010/0270982 A1 10/2010 Hausman, Jr. et al.
2010/0284207 A1 11/2010 Watanabe et al.
2010/0296207 A1 11/2010 Schumacher et al.
2010/0320840 A1 12/2010 Fridberg
2011/0062936 A1 3/2011 Bartelous
2011/0121752 A1 5/2011 Newman, Jr. et al.
2011/0127922 A1 6/2011 Sauerlaender
2011/0156610 A1 6/2011 Ostrovsky et al.
2011/0227615 A1 9/2011 Faison
2011/0234000 A1 9/2011 Yan et al.
2011/0273103 A1 11/2011 Hong
2011/0292703 A1 12/2011 Cuk
2011/0301894 A1 12/2011 Sanderford, Jr.
2011/0305054 A1 12/2011 Yamagiwa et al.
2011/0307447 A1 12/2011 Sabaa et al.
2012/0026632 A1 2/2012 Acharya et al.
2012/0075897 A1 3/2012 Fujita
2012/0080942 A1 4/2012 Carralero et al.
2012/0086416 A1 4/2012 Kudo et al.
2012/0089266 A1 4/2012 Tomimbang et al.
2012/0089366 A1 4/2012 Huyse
2012/0092797 A1 4/2012 Reeder et al.
2012/0095605 A1 4/2012 Tran
2012/0120700 A1 5/2012 Elberbaum
2012/0133289 A1 5/2012 Hum et al.
2012/0275076 A1 11/2012 Shono
2012/0323510 A1 12/2012 Bell et al.
2013/0021708 A1 1/2013 Demetriades et al.
2013/0026925 A1 1/2013 Ven et al.
2013/0033246 A1 2/2013 Krenz et al.
2013/0051102 A1 2/2013 Huang et al.
2013/0057247 A1 3/2013 Russell et al.
2013/0063851 A1 3/2013 Stevens et al.
2013/0066478 A1 3/2013 Smith
2013/0088160 A1 4/2013 Chai et al.
2013/0119958 A1 5/2013 Gasperi
2013/0128396 A1 5/2013 Danesh et al.
2013/0170261 A1 7/2013 Lee et al.
2013/0176758 A1 7/2013 Tseng et al.
2013/0187631 A1 7/2013 Russell et al.
2013/0253898 A1 9/2013 Meagher et al.
2013/0261821 A1 10/2013 Lu et al.
2013/0265041 A1 10/2013 Friedrich et al.
2013/0329331 A1 12/2013 Erger et al.
2014/0043732 A1 2/2014 McKay et al.
2014/0049117 A1 2/2014 Rahman
2014/0067137 A1 3/2014 Amelio et al.
2014/0085940 A1 3/2014 Lee et al.

(56) References Cited

U.S. PATENT DOCUMENTS

2014/0097809 A1 4/2014 Follic et al.
2014/0159593 A1 6/2014 Chu et al.
2014/0164294 A1 6/2014 Osann, Jr.
2014/0203718 A1 7/2014 Yoon et al.
2014/0268935 A1 9/2014 Chiang
2014/0268956 A1 9/2014 Teren et al.
2014/0276753 A1 9/2014 Wham et al.
2014/0365490 A1 12/2014 Yang et al.
2015/0042274 A1 2/2015 Kim et al.
2015/0055261 A1 2/2015 Lubicki et al.
2015/0097430 A1 4/2015 Scruggs
2015/0116886 A1 4/2015 Zehnder et al.
2015/0155789 A1 6/2015 Freeman et al.
2015/0180469 A1 6/2015 Kim
2015/0185262 A1 7/2015 Song et al.
2015/0216006 A1 7/2015 Lee et al.
2015/0236587 A1 8/2015 Kim et al.
2015/0256355 A1 9/2015 Pera et al.
2015/0256665 A1 9/2015 Pera et al.
2015/0317326 A1 11/2015 Bandarupalli et al.
2016/0057841 A1 2/2016 Lenig
2016/0069933 A1 3/2016 Cook et al.
2016/0077746 A1 3/2016 Muth et al.
2016/0079757 A1 3/2016 Matan et al.
2016/0081143 A1 3/2016 Wang
2016/0126031 A1 5/2016 Wootton et al.
2016/0178691 A1 6/2016 Simonin
2016/0181941 A1 6/2016 Gratton et al.
2016/0195864 A1 7/2016 Kim
2016/0247799 A1 8/2016 Stafanov et al.
2016/0294179 A1 10/2016 Kennedy et al.
2016/0301319 A1 10/2016 Vermulst
2016/0322807 A1 11/2016 Milkie
2016/0322809 A1 11/2016 Wang et al.
2016/0360586 A1 12/2016 Yang et al.
2016/0381754 A1 12/2016 Chou et al.
2017/0004948 A1 1/2017 Leyh
2017/0019969 A1 1/2017 O'Neil et al.
2017/0063225 A1 3/2017 Guo et al.
2017/0067961 A1 3/2017 O'Flynn
2017/0086281 A1 3/2017 Avrahamy
2017/0104325 A1 4/2017 Eriksen et al.
2017/0105265 A1 4/2017 Sadwick
2017/0110878 A1 4/2017 Jacobson
2017/0168516 A1 6/2017 King
2017/0170730 A1 6/2017 Sugiura
2017/0179946 A1 6/2017 Turvey
2017/0214967 A1 7/2017 Xia et al.
2017/0244241 A1 8/2017 Wilson et al.
2017/0256934 A1 9/2017 Kennedy et al.
2017/0256956 A1 9/2017 Irish et al.
2017/0265287 A1 9/2017 Avrahamy
2017/0277709 A1 9/2017 Strauss et al.
2017/0314743 A1 11/2017 Del Castillo et al.
2017/0322049 A1 11/2017 Wootton et al.
2017/0322258 A1 11/2017 Miller et al.
2017/0338809 A1 11/2017 Stefanov et al.
2017/0347415 A1 11/2017 Cho et al.
2018/0026534 A1 1/2018 Turcan
2018/0054862 A1 2/2018 Takagimoto et al.
2018/0059175 A1 3/2018 Hase
2018/0130618 A1 5/2018 Ramirez
2018/0188706 A1 7/2018 Wootton et al.
2018/0201302 A1 7/2018 Sonoda et al.
2018/0285198 A1 10/2018 Dantkale et al.
2018/0307609 A1 10/2018 Qiang et al.
2018/0313873 A1* 11/2018 Hu .................... G01R 19/0092
2018/0316179 A1 11/2018 Ofek
2018/0323723 A1 11/2018 Mochizuki
2018/0351342 A1 12/2018 Anderson et al.
2019/0003855 A1 1/2019 Wootton et al.
2019/0052174 A1 2/2019 Gong
2019/0103742 A1 4/2019 Kennedy et al.
2019/0122834 A1 4/2019 Wootton et al.
2019/0140640 A1 5/2019 Telefus et al.
2019/0148931 A1 5/2019 Li
2019/0165691 A1 5/2019 Telefus et al.
2019/0181679 A1 6/2019 Northway et al.
2019/0207375 A1 7/2019 Telefus et al.
2019/0222058 A1 7/2019 Sharifipour
2019/0238060 A1 8/2019 Telefus et al.
2019/0245457 A1 8/2019 Telefus et al.
2019/0280887 A1 9/2019 Telefus et al.
2019/0312460 A1 10/2019 Van Boheemen et al.
2019/0372331 A1 12/2019 Liu et al.
2020/0007126 A1 1/2020 Telefus et al.
2020/0014301 A1 1/2020 Telefus
2020/0014379 A1 1/2020 Telefus
2020/0044883 A1 2/2020 Telefus et al.
2020/0052607 A1 2/2020 Telefus et al.
2020/0106259 A1 4/2020 Telefus
2020/0106260 A1 4/2020 Telefus
2020/0196412 A1 6/2020 Telefus et al.
2020/0287537 A1 9/2020 Telefus et al.
2020/0328694 A1 10/2020 Telefus et al.
2020/0365345 A1 11/2020 Telefus et al.
2020/0365346 A1 11/2020 Telefus et al.
2020/0365356 A1 11/2020 Telefus et al.
2020/0366078 A1 11/2020 Telefus et al.
2020/0366079 A1* 11/2020 Telefus .................... H02H 3/08
2021/0014947 A1 1/2021 Telefus et al.
2021/0119528 A1 4/2021 Telefus
2021/0173364 A1 6/2021 Telefus et al.
2021/0226441 A1* 7/2021 Telefus .................. H02H 3/162
2021/0234356 A1 7/2021 Telefus et al.
2021/0335563 A1 10/2021 Guziak
2021/0336555 A1 10/2021 Telefus
2021/0345462 A1 11/2021 Telefus et al.
2022/0052533 A1 2/2022 Telefus et al.
2022/0189721 A1 6/2022 Telefus et al.
2022/0255310 A1 8/2022 Telefus
2022/0311350 A1 9/2022 Telefus
2022/0399174 A1 12/2022 Telefus et al.
2022/0416681 A1 12/2022 Telefus
2023/0067227 A1 3/2023 Telefus
2023/0121575 A1 4/2023 Baker
2023/0127078 A1 4/2023 Telefus et al.
2023/0137013 A1 5/2023 Telefus
2023/0162937 A1 5/2023 Telefus et al.
2023/0253799 A1 8/2023 Telefus et al.
2023/0261560 A1 8/2023 Baker et al.
2024/0178653 A1 5/2024 Telefus et al.

FOREIGN PATENT DOCUMENTS

CN 108075449 A 5/2018
CN 109075551 B 1/2021
DE 19712261 A1 10/1998
DE 102013106798 A1 * 1/2014 .......... H03K 17/687
EP 0016646 A1 10/1980
EP 0398026 A2 11/1990
EP 2560063 A1 2/2013
GB 1302357 A 1/1973
GB 2396982 A 7/2004
GB 2458699 A 9/2009
GB 2556081 A 5/2018
JP 06-053779 A 2/1994
JP 2001196908 A 7/2001
JP 2006014479 A 1/2006
JP 2007110844 A 4/2007
JP 2010103099 A 5/2010
JP 2010530730 A 9/2010
JP 2012244716 A 12/2012
JP 2013230034 A 11/2013
JP 2014030355 A 2/2014
JP 2016092881 A 5/2016
JP 2016213179 A 12/2016
JP 2017208938 A 11/2017
JP 2019515639 A 6/2019
JP 6997105 B2 1/2022
WO 9829927 A2 7/1998
WO 9829928 A2 7/1998
WO 9829930 A2 7/1998
WO 9829931 A2 7/1998

(56) References Cited

FOREIGN PATENT DOCUMENTS

| | | | | |
|---|---|---|---|---|
| WO | 2010110951 A1 | | 9/2010 | |
| WO | 2014152794 A1 | | 9/2014 | |
| WO | 2016105505 A1 | | 6/2016 | |
| WO | 2016110833 A2 | | 7/2016 | |
| WO | 2017196571 A1 | | 11/2017 | |
| WO | 2017196572 A1 | | 11/2017 | |
| WO | 2017196649 A1 | | 11/2017 | |
| WO | 2018075726 A1 | | 4/2018 | |
| WO | 2018080604 A1 | | 5/2018 | |
| WO | 2018080614 A1 | | 5/2018 | |
| WO | 2018081619 A2 | | 5/2018 | |
| WO | 2018081619 A3 | | 5/2018 | |
| WO | 2018159914 A1 | | 9/2018 | |
| WO | 2019133110 A1 | | 7/2019 | |
| WO | 2020014158 A1 | | 1/2020 | |
| WO | 2020014161 A1 | | 1/2020 | |
| WO | PCT/US19/54102 | | 2/2020 | |
| WO | 2020072516 A1 | | 4/2020 | |
| WO | PCT/US19/67004 | | 4/2020 | |
| WO | 2020131977 A1 | | 6/2020 | |
| WO | PCT/US20/33421 | | 9/2020 | |
| WO | 2020236726 A1 | | 11/2020 | |
| WO | PCT/US21/14320 | | 4/2021 | |
| WO | 2021112870 A1 | | 6/2021 | |
| WO | 2021150684 A1 | | 7/2021 | |
| WO | 2021183172 A1 | | 9/2021 | |
| WO | PCT/US21/45624 | | 11/2021 | |
| WO | 2022036016 A1 | | 2/2022 | |
| WO | WO-2022031276 A1 | * | 2/2022 | ............ H05B 45/50 |
| WO | 2024006354 A1 | | 1/2024 | |
| WO | 2024049836 A2 | | 3/2024 | |

OTHER PUBLICATIONS

J.-E. Park et al., "Design on Topologies for High Efficiency Two-Stage AC-DC Converter," 2012 IEEE 7th International Power Electronics and Motion Control Conference—ECCE Asia, Jun. 2-5, 2012, China, 6 pages.
S. Cuk, "98% Efficient Single-Stage AC/DC Converter Topologies," Power Electronics Europe, Issue 4, 2011, 6 pages.
E. Carvou et al., "Electrical Arc Characterization for Ac-Arc Fault Applications," 2009 Proceedings of the 55th IEEE Holm Conference on Electrical Contacts, IEEE Explore Oct. 9, 2009, 6 pages.
C. Restrepo, "Arc Fault Detection and Discrimination Methods," 2007 Proceedings of the 53rd IEEE Holm Conference on Electrical Contacts, IEEE Explore Sep. 24, 2007, 8 pages.
K. Eguchi et al., "Design of a Charge-Pump Type AC-DC Converter for RF-ID Tags," 2006 International Symposium on Communications and Information Technologies, F4D-3, IEEE, 2006, 4 pages.
A. Ayari et al., "Active Power Measurement Comparison Between Analog and Digital Methods," International Conference on Electrical Engineering and Software Applications, 2013, 6 pages.
G. D. Gregory et al., "The Arc-Fault Circuit Interrupter, an Emerging Product," IEEE, 1998, 8 pages.
D. Irwin et al., "Exploiting Home Automation Protocols for Load Monitoring in Smart Buildings," BuildSys '11: Proceedings of the Third ACM Workshop on Embedded Sensing Systems for Energy-Efficiency in Buildings, Nov. 2011, 6 pages.
B. Mrazovac et al., "Towards Ubiquitous Smart Outlets for Safety and Energetic Efficiency of Home Electric Appliances," 2011 IEEE International Conference on Consumer Electronics, Berlin, German, Sep. 6-8, 2011, 5 pages.
L. Shengyuan et al., "Instantaneous Value Sampling AC-DC Converter and its Application in Power Quantity Detection," 2011 Third International Conference on Measuring Technology and Mechatronics Automation, Jan. 6-7, 2011, 4 pages.
H.-H. Chang et al., "Load Recognition for Different Loads with the Same Real Power and Reactive Power in a Non-intrusive Load-monitoring System," 2008 12th International Conference on Computer Supported Cooperative Work in Design, Apr. 16-18, 2008, 6 pages.
Darmayuda et al., "Ultra Fast Solid State Ground Fault Isolator," International Journal of Electronics and Communication Engineering, vol. 6, No. 9, Oct. 2012, pp. 902-905.
International Patent Application No. PCT/US2023/086364 filed in the name of Mark Telefus et al. on Dec. 29, 2023, and entitled "Bidirectional Switch Device Implemented Using a Diode Bridge."
International Patent Application No. PCT/US2024/026577 filed in the name of Mark Telefus et al. on Apr. 26, 2024, and entitled "AC-to-DC Converter with Intelligent Capacitive Energy Storage Regulator."
U.S. Appl. No. 18/674,058 filed in the name of Mark Telefus on May 24, 2024, and entitled "Intelligent Power Distribution And Regulation."

* cited by examiner 100
110
DC POWER GENERATION AND CONTROL SYSTEM
120
AC-to-DC CONVERSION
GND
VDC
130
DC-to-DC CONVERSION
GND
DC RAIL VOLTAGE(S)
140
CONTROL CIRCUITRY
GND
G_Con
160
EXTERNAL DC-POWERED COMPONENT(S)
GND
102
AC REF2 (e.g., Neutral (N))
N
10
AC
L
101
AC REF1 (e.g., Line (L))
N1
150
151-1
Common Reference
152-1
D
S
N3
GND
S
D
N2
153
N4
154
G
G
151
152
G_Con
103
Load Hot Line
12
LOAD
AC REF2 (e.g., Neutral)
Load Neutral Line

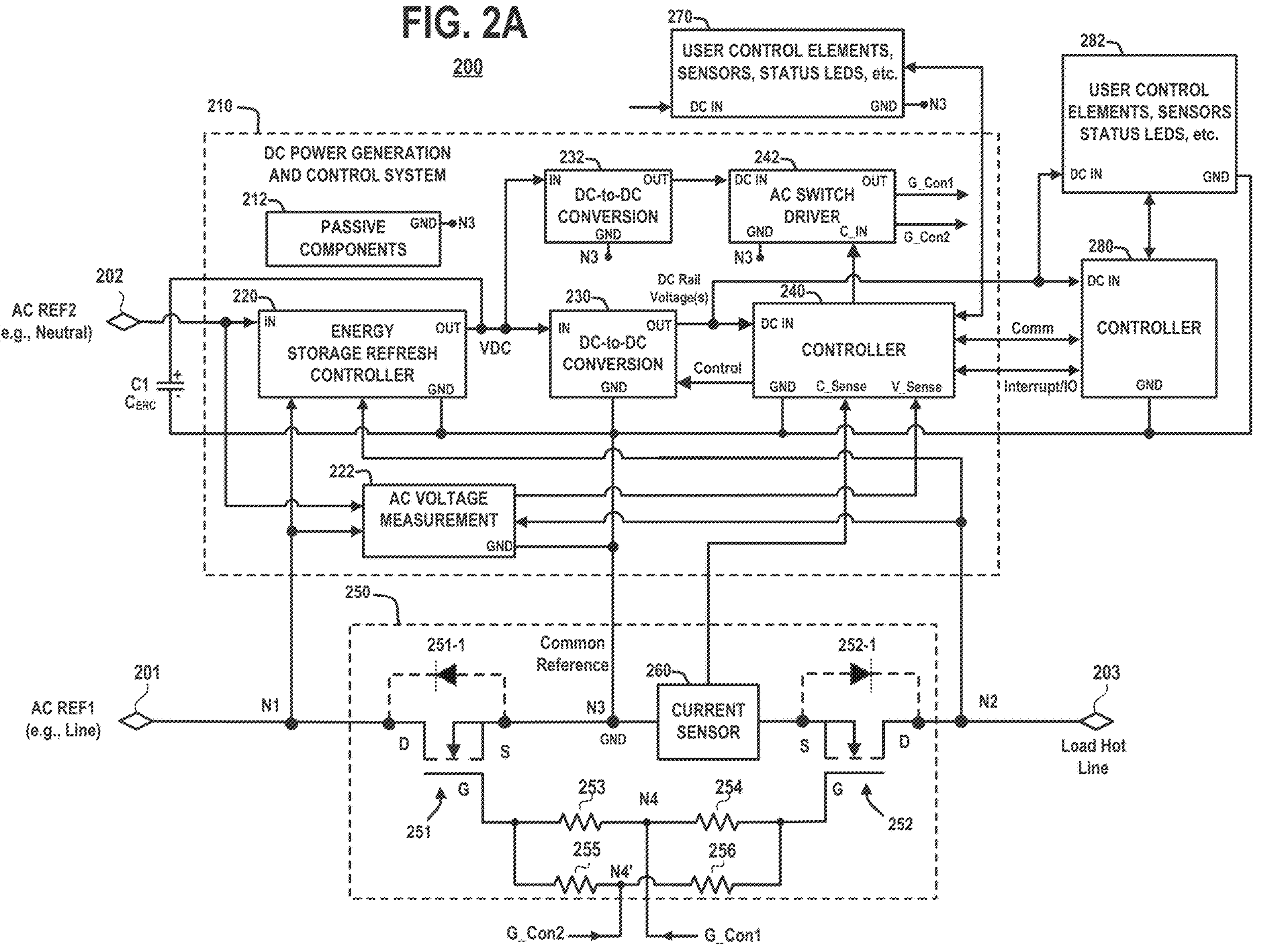
FIG. 2A
200
270
USER CONTROL ELEMENTS, SENSORS, STATUS LEDS, etc.
DC IN
GND
N3
282
USER CONTROL ELEMENTS, SENSORS STATUS LEDS, etc.
210
DC POWER GENERATION AND CONTROL SYSTEM
212
PASSIVE COMPONENTS
232
DC-to-DC CONVERSION
IN
OUT
242
AC SWITCH DRIVER
C_IN
G_Con1
G_Con2
202
AC REF2 (e.g., Neutral)
220
ENERGY STORAGE REFRESH CONTROLLER
VDC
230
DC-to-DC CONVERSION
DC Rail Voltage(s)
Control
240
CONTROLLER
C_Sense
V_Sense
280
CONTROLLER
Comm
Interrupt/IO
C1
C_ERC
222
AC VOLTAGE MEASUREMENT
250
251-1
Common Reference
260
CURRENT SENSOR
252-1
201
AC REF1 (e.g., Line)
N1
N3
N2
203
Load Hot Line
D
S
G
251
252
253
254
255
256
N4
N4'

FIG. 2B (VCC Generator)

(Power-Up Peak Voltage Detector and Control Circuitry)

ENERGY STORAGE REFRESH CONTROLLER
500
520
VCC Generator
410
VDC
N10
VCC
N20
C4
522
VTH
VFB
Vpp_Cont
Latch Reset
526
Neutral (N)
N18
N_neg
R
S
Q
524
GND
N14
R7
FET_Off
Q5
R11
R9
N9
R6
N19
R8
Z15
R13
N8
R14
POWER-UP PEAK VOLTAGE DETECTOR AND CONTROL CIRCUITRY
430
N15
VDC_FDBK
D17
N10
D8
C1
VDC
440
R5
N17
N16
Q12
Q1
D
S
G
N11
R10
C10
Z1
+ Vz -
N12
Pre_CH
R1
R12
D10
N13
Q23
Z2
Off_FET_D
N5
D1
D2
203
Load Hot Line
N2
N1
201
AC REF1 (e.g., Line)
250
251
251-1
252
252-1
260
Current Sensor Device
N3
GND
253
254
N4
G_Control

LATCH RESET

N15
VDC_FDBK
Neutral (N)
N18
LATCH RESET AND
POLARITY DETECTION CIRCUIT
626
D32
Q28
R33
R32
Z33
Z34
N32
GND
N_pos
D31
FET_Off
N14
VCC
624
N_pos
Vpp_cont
VOLTAGE DETECTION AND LATCH CIRCUIT
622
620
Z30
VDC_N_pos
Z32
D30
N30
Q16
N31
R31
R30
Q18
C30
GND
Z31

AC-TO-DC POWER CONVERSION WITH GROUND REFERENCE TO COMMON NODE OF SOLID-STATE AC SWITCH

CROSS-REFERENCE TO RELATED APPLICATION

This application claims the benefit of U.S. Provisional Application Ser. No. 63/521,055, filed on Jun. 14, 2023, the disclosure of which is incorporated herein by reference.

BACKGROUND

This disclosure relates generally to systems and methods for generating and managing the supply of direct current (DC) power for electronic components. The generation and distribution of DC power for integrated circuits chips and electronic components on a package substrate or printed circuit board, etc., can be challenging. For example, it can be difficult to implement a DC power supply system that delivers the required power to electronic components in instances where different electronic components require a different operating DC supply voltages and where the power requirements of a given electronic system or device can dynamically vary over time. Moreover, intelligent electrical devices (e.g., intelligent circuit breakers, intelligent dimmer switches, etc.) that control AC power to loads can implement control circuitry and AC-to-DC converter circuitry to convert AC power to DC power to operate the control circuitry. In instances where the DC power generation and DC-powered control circuitry is ground referenced to, e.g., a line L phase or neutral N line that supplies AC mains power, the electrical device must implement some form of AC-DC isolation. For example, an isolated AC-to-DC converter uses a transformer and/or other components to provide isolation or galvanic isolation (physically and electrically separate) between the AC input and DC output circuits. The AC-DC isolation components and circuitry add to the complexity of device design as well as increase the footprint of the control circuitry of the intelligent device, which is undesirable.

SUMMARY

Exemplary embodiments of the disclosure include techniques for utilizing a common node of a solid-state AC switch as a DC ground reference node for DC power generation and control circuitry of an intelligent electrical device (e.g., intelligent dimmer switch, intelligent circuit breaker, etc.).

For example, an exemplary embodiment includes a device which comprises a solid-state AC switch, and a power converter circuit. The solid-state AC switch comprises a first solid-state switch and a second solid-state switch which are coupled back-to-back to common node of the solid-state AC switch. The power converter circuit is coupled to the common node of the solid-state AC switch and is configured to convert an AC voltage to a direct current (DC) voltage. The common node of the solid-state AC switch is utilized as a DC ground node of the power converter circuit, and the DC voltage output from the power converter circuit is ground referenced to the common node of the solid-state AC switch.

Another exemplary embodiment includes a power convert circuit which comprises comprise, a first terminal, a second terminal, a storage capacitor, a first solid-state switch, and control circuitry. The first and second terminals are configured to couple to an AC power source which provides AC power. The storage capacitor is coupled to and between an output node of the power converter circuit and a DC ground node. The first solid-state switch is disposed in an electrical path between the second terminal and the output node. The control circuitry is configured to control an operation of the first solid-state switch for sourcing a charging current from the AC power, which flows from the second terminal to the output node, to charge the storage capacitor and generate a DC voltage at the output node. The control circuitry is configured to monitor a DC voltage at the output node, and determine an occurrence of a transition to a negative half-cycle of the AC power. In response to determining the occurrence of the transition to the negative half-cycle of the AC power, the control circuitry is further configured to: cause the first solid-state switch to be deactivated to disable the sourcing of the charging current to the output node, in response to determining that the monitored DC voltage at the output node is at a maximum DC voltage or greater than a minimum DC voltage; and cause the first solid-state switch to be activated to enable the sourcing of the charging current to the output node to charge the storage capacitor to the maximum DC voltage, in response to determining that the monitored DC voltage at the output node is at or below the minimum DC voltage.

Other embodiments will be described in the following detailed description of exemplary embodiments, which is to be read in conjunction with the accompanying figures.

BRIEF DESCRIPTION OF THE DRAWINGS

FIGS. 2A and 2B schematically illustrate an electrical device which comprises DC power generation and control circuitry having a DC ground that is referenced to a common node connection of a bidirectional solid-state switch, according to another exemplary embodiment of the disclosure.

DETAILED DESCRIPTION

Figure 1:
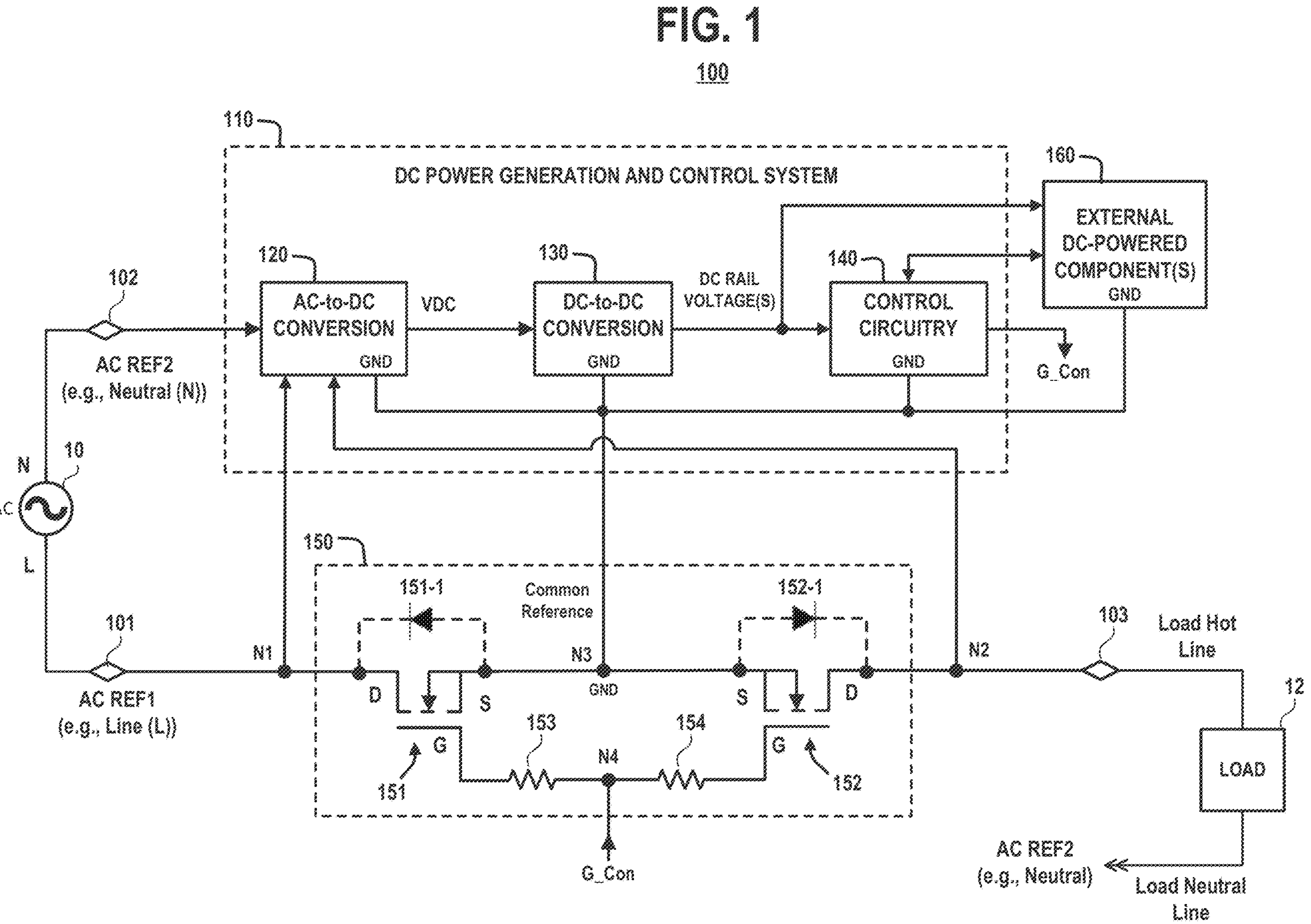
FIG. 1 is a high-level schematic illustration of an electrical device which comprises DC power generation and control circuitry having a DC ground that is referenced to a common node connection of a bidirectional solid-state switch, according to an exemplary embodiment of the disclosure.

Embodiments of the disclosure will now be described in further detail with regard to techniques for utilizing a common node of a solid-state AC switch as a DC ground reference node for DC power generation and control circuitry of an intelligent electrical device (e.g., intelligent dimmer switch, intelligent circuit breaker, etc.).

It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise discrete circuit elements (e.g., transistors, inverters, etc.), programmable elements (e.g., application specific integrated circuit (ASIC) chips, field-programmable gate array (FPGA) chips, etc.), processing devices (e.g., central processing units (CPUs), graphics processing units (GPUs), etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

The term $V_{NL}$ as used herein in the context of an AC voltage (e.g., AC mains voltage) denotes a neutral (N)-to-line (L) voltage. With this convention, the exemplary AC voltage measurement techniques as discussed herein refer to measuring neutral N voltage with respect to line L voltage. In this regard, a positive $V_{NL}$ means that neutral N is positive with respect to line L (N is more positive than L), and a negative $V_{NL}$ means that neutral N is negative with respect to line L (N is more negative than L). Further, the terms "negative cycle of $V_{NL}$" or "neutral negative cycle" refer to half-cycles of the AC voltage where $V_L$ is negative. In addition, the terms "positive cycle of $V_N$," or "neutral positive cycle" refer to half-cycles of the AC voltage where $V_{NL}$ is positive.

FIG. 1 is a high-level schematic illustration of an electrical device which comprises DC power generation and control circuitry having a DC ground that is referenced to a common node connection of a bidirectional solid-state switch, according to an exemplary embodiment of the disclosure. More specifically, FIG. 1 schematically illustrates an electrical device 100 which comprises a first terminal 101, a second terminal 102, a third terminal 103, and a DC power generation and control system 110 comprising AC-to-DC conversion circuitry 120, DC-to-DC conversion circuitry 130, and control circuitry 140. The electrical device 100 further comprises a solid-state AC switch 150, current limiting resistors 153 and 154, and one or more optional external DC-powered components 160.

In some embodiments, the solid-state AC switch 150 is a bidirectional solid-state switch comprising a first solid-state switch 151 and a second solid-state switch 152, which are serially connected between a first node N1 and a second node N2, and which are coupled back-to-back at a third node N3. As explained in further detail below, the third node N3 is a common node of the solid-state AC switch 150, which serves as a DC ground (GND) reference node for DC power generation, as well as the DC-powered control circuitry and components of the electrical device 100. In some embodiments, the solid-state AC switch 150 comprises a bidirectional MOSFET switch in which the first and second solid-state switches 151 and 152 comprise power MOSFET devices, e.g., N-type enhancement MOSFET devices, having respective gate terminals (G), drain terminals (D), and source terminals (S). The drain (D) terminal of the first solid-state switch 151 is coupled to the first node N1, and the drain (D) terminal of the second solid-state switch 152 is coupled to the second node N2. The source terminals (S) of the first and second solid-state switches 151 and 152 are commonly coupled at the third node N3, thereby implementing a common source bidirectional MOSFET switch configuration. The gate (G) terminals of the first and second solid-state switches 151 and 152 are commonly connected to a fourth node N4 through the respective current limiting resistors 153 and 154.

As further shown in FIG. 1, the first and second solid-state switches 151 and 152 comprise intrinsic body diodes 151-1 and 152-1, respectively, wherein each intrinsic body diode 151-1 and 152-1 represents a P-N junction between a P-type substrate body and an N-doped drain region of the respective N-type MOSFET device. It is to be noted that intrinsic body-to-source diodes of the first and second solid-state switches 151 and 152 are not shown as such intrinsic body-to-source diodes are assumed to be shorted out by a common connection between the source terminal (S) and a body terminal (e.g., the N+ source region and P-doped body junction are shorted through source metallization).

While FIG. 1 illustrates an exemplary embodiment in which the solid-state AC switch 150 comprises two MOSFET devices, e.g., the first and second solid-state switches 151 and 152, in some embodiments, each of the first and second solid-state switches 151 and 152 can be implemented with two or more MOSFET devices connected in parallel, wherein such configuration enables enhanced heat dissipation and enhanced power handling. Furthermore, in some embodiments, the solid-state AC switch 150 can be implemented using other types of solid-state switch devices. For example, in some embodiments, the first and second solid-state switches 151 and 152 are implemented using integrated gate bipolar transistor (IGBT) devices having emitter terminals that are commonly connected at the DC common reference node N3. In other embodiments, the first and second solid-state switches 151 and 152 can be implemented using other types of FET devices including, but not limited to, GaN (Gallium Nitride) FET devices, cascode GaN FET devices, silicon carbide (SiC) junction FET devices, cascode SiC junction FET devices, etc.

In all embodiments, the solid-state AC switch 150 is configured to (i) allow the bidirectional flow of AC current in the electrical path between the first terminal 101 and the third terminal 103 when the solid-state AC switch is in a switched-on state and (ii) interrupt the bidirectional flow of AC current in the electrical path between first terminal 101 and the third terminal 103 when the solid-state AC switch 150 is in a switched-off state. For purposes of illustration, FIG. 1 shows an AC power source 10 coupled to the first and second terminals 101 and 102, and an AC load 12 coupled to the third terminal 103. In some embodiments, the AC power source 10 comprises a utility power supply (e.g., AC mains) which provides an AC voltage waveform with a frequency of 60 Hz and, e.g., a voltage of 120V RMS (with a positive peak voltage of about 170V and a negative peak voltage of about −170V). In other embodiments, the AC power source 10 can be other sources of AC power at different voltage levels and/or frequencies.

Moreover, in the non-limiting exemplary embodiment shown in FIG. 1, assuming the AC power source 10 comprises a utility power system, the electrical device 100 is coupled to a phase of the AC power source 10, e.g., the first terminal 101 is coupled to a hot line (L) (or hot phase) of the AC power source 10, and the second terminal 102 is coupled to a neutral line (N) of the AC power source 10, wherein the neutral line (N) is a grounded conductor of the AC mains power source. In addition, a load neutral line of the AC load 12 is coupled to the neutral N line of the AC power source 10. As explained in further detail below, in some embodiments, the electrical device 100 supports a "line-load swap" where the first terminal 101 can be coupled to the load hot line of the AC load 12 and the third terminal 103 can be coupled to the hot line (L) (or hot phase) of the AC power source 10.

In general, the DC power generation and control system 110 comprises various electronic components and circuitry to generate DC power from AC power and utilize the DC power to operate control circuitry of the electrical device 100. In particular, the AC-to-DC conversion circuitry 120 is configured to utilize the AC power source 10 to generate a DC voltage (denoted VDC) having a programmable maximum voltage (e.g., 60V). In some embodiments, as explained in further detail below, the AC-to-DC conversion circuitry 120 is configured to utilize current drawn from the AC power source 10 to charge a storage capacitor to maximum voltage VDC_max, and then recharge the storage capacitor when the voltage VDC across the capacitor decreases to a threshold voltage.

The DC-to-DC conversion circuitry 130 is configured to convert the voltage VDC into one or more regulated DC rail voltages that are used as DC supply voltages to operate the control circuitry 140 and other external DC-powered components 160. In some embodiments, the DC-to-DC conversion circuitry 130 comprises one or more DC-DC step-down voltage switching regulator circuits (e.g., Buck switching regulators), or DC-DC linear regulator circuits, which are configured to convert the voltage VDC into or more regulated DC rail voltages with different voltage levels. In some embodiments, the DC-to-DC conversion circuitry 130 is configured to convert the voltage VDC into, e.g., one or more industry standard DC voltages including, but not limited to 12V, 10V, 5V, 3.3V, 2.5V, 2.7V, 1.8V, etc., as needed, depending on the DC supply voltage requirements of the control circuitry 140 and the external DC-powered components 160.

The control circuitry 140 is configured to intelligently control various functions and operations of the electrical device 100. For example, in some embodiments, the control circuitry 140 comprises at least one hardware processor (e.g., CPU, microcontroller, etc.) which is configured to execute logic to perform various intelligent control operations depending on the device type (e.g., dimmer switch, circuit breaker, circuit interrupter, etc.) of the electrical device 100. In some embodiments, the control circuitry 140 comprises switch driver circuitry which is configured to generate a gate control signal (denoted G_Con) to control the operation of the solid-state AC switch 150. As shown in FIG. 1, the gate control signal G_Con is applied to node N4 and thus applied to the gate (G) terminals of the first and second solid-state switches 151 and 152. As explained in further detail below, the manner in which the gate control signal G_Con is generated and utilized to control or otherwise modulate the activation and deactivation of the solid-state AC switch 150 will vary depending on the given application and/or the device type of the electrical device 100.

The external DC-powered components 160 comprise one or more optional components that may be implemented depending on the device type of the electrical device 100. For example, for intelligent light switches, the external DC-powered components 160 may include one or more types of sensor circuitry (e.g., light sensors, motion sensors, etc.) which generate sensor signals that are processed by the control circuitry 140 to control operation of the solid-state AC switch 150. Furthermore, the external DC-powered components 160 may comprise one or more types of manual switch control elements (e.g., on/off control, dimmer control, etc.) and associated hardware interfaces of the switch control elements, etc., to enable manual user control of the electrical device 100.

Moreover, in some embodiments, the external DC-powered components 160 may comprise one or more hardware processor devices (e.g., microcontrollers) that operate in conjunction with the control circuitry 140 to control operations of the electrical device 100, e.g., control the generation of the switch control signal G_Con to thereby control the operation of the solid-state AC switch 150. For example, in some embodiments, the DC power generation and control system 110 is configured to (i) generate the DC power needed to operate the external DC-powered components 160 (e.g., external microprocessor), and (ii) implement internal control logic to provide basic and/or default functionality for a given device type of the electrical device 100, while the external microprocessor implements custom control logic that is used in place of, or in conjunction with, the internal control logic of the control circuitry 140 to perform intelligent control functions of the electrical device 100.

In some embodiments, the DC power generation and control system 110 comprises a system-on-a-chip (SoC) device in which the various components 120, 130, and 140 comprise integrated circuits that are contained on a single integrated circuit chip. In other embodiments, the DC power generation and control system 110 comprises system-in-package (SIP) device in which the various components 120, 130, and 140 comprise one or more integrated circuit chips which are integrated along with individual active and/or passive circuit components into a single package structure. In such embodiments, the solid-state AC switch 150 and the optional external DC-powered components 160 are operatively coupled to (and packaged together with) the DC power generation and control system 110.

In this regard, the DC power generation and control system 110 comprises an integrated package structure (or core system) that can be utilized in various types of intelligent electrical devices to provide DC power and some or all of the control logic and functionality for operating the solid-state AC switch 150 and other components of the electrical device. The AC-to-DC conversion circuitry 120 and the DC-to-DC conversion circuitry 130 are designed to implement a DC power generation system that can generate different DC supply voltage levels from AC power, while providing sufficient DC power to operate the control circuitry 140 as well as any optional external DC-powered components 160 that are connected to the DC power generation and control system 110.

As schematically illustrated in FIG. 1, for a "line-load swap" configuration, the AC-to-DC conversion circuitry 120 comprises input terminal that are respectively coupled to the first terminal 101 (node N1), the second terminal 102 (e.g., neutral N node), and the third terminal 103 (node N2). The "line-load swap" configuration allows the AC power (e.g., line (L) phase) to be connected to either the first terminal 101 (node N1) or the third terminal 103 (node N3), and the load hot line of the AC load 12 to be connected to the either the third terminal 103 or first terminal 101. The "line-load swap" configuration ensures that the AC-to-DC conversion circuitry 120 is be properly coupled to the AC power source 10 (e.g., line L and neutral N) and thereby generate the voltage VDC upon initial power-up of the electrical device 100 (e.g., when first connected to the AC power source 10) and during real-time operation, irrespective of whether the AC power source 10 (e.g., line L phase) is coupled to the first terminal 101 (node N1) or the third terminal 103 (node N2). In some embodiments, as explained in further detail below in conjunction with FIG. 2B, the AC-to-DC conversion circuitry 120 comprises circuitry which is configured to detect, upon power-up, which of the nodes N1 or N2 is connected to the AC power source 10 (e.g., line L phase), and then perform AC-to-DC conversion and other operations accordingly. Alternatively, if "line-load swap" is not needed, the electrical connection between node N2 and the AC-to-DC conversion circuitry 120 is not needed.

Furthermore, the AC-to-DC conversion circuitry 120 comprises a ground GND terminal that is coupled to the node N3. In addition, the DC-to-DC conversion circuitry 130, the control circuitry 140, and the external DC-powered component(s) 160 have respective ground GND terminals that are coupled to the node N3. As noted above, the node N3 is a common node of the solid-state AC switch 150 which serves as a DC ground reference node for DC power generation, as well as a ground for the DC-powered control circuitry and components of the electrical device 100. In this regard, the DC voltages that are generated by the AC-to-DC conversion circuitry 120 and the DC-to-DC conversion circuitry 130 are all ground referenced to the node N3. This allows, among other things, the control circuitry 140 to directly drive the solid-state AC switch 150 with a gate control voltage G_Con without the need for AC-DC isolation. This is in contrast to conventional AC-to-DC generation techniques in which the DC voltages are referenced to line L or neutral N, in which case AC-DC isolation circuitry would be needed to drive the solid-state AC switch 150. However, in the exemplary configuration shown in FIG. 1, since the gate control voltage G_Con is referenced to the common source node (node N3) of the first and second solid-state switches 151 and 152, the DC gate-to-source voltage $V_{GS}$ will remain constant despite the AC voltage swing at the node N3.

Figure 2B:
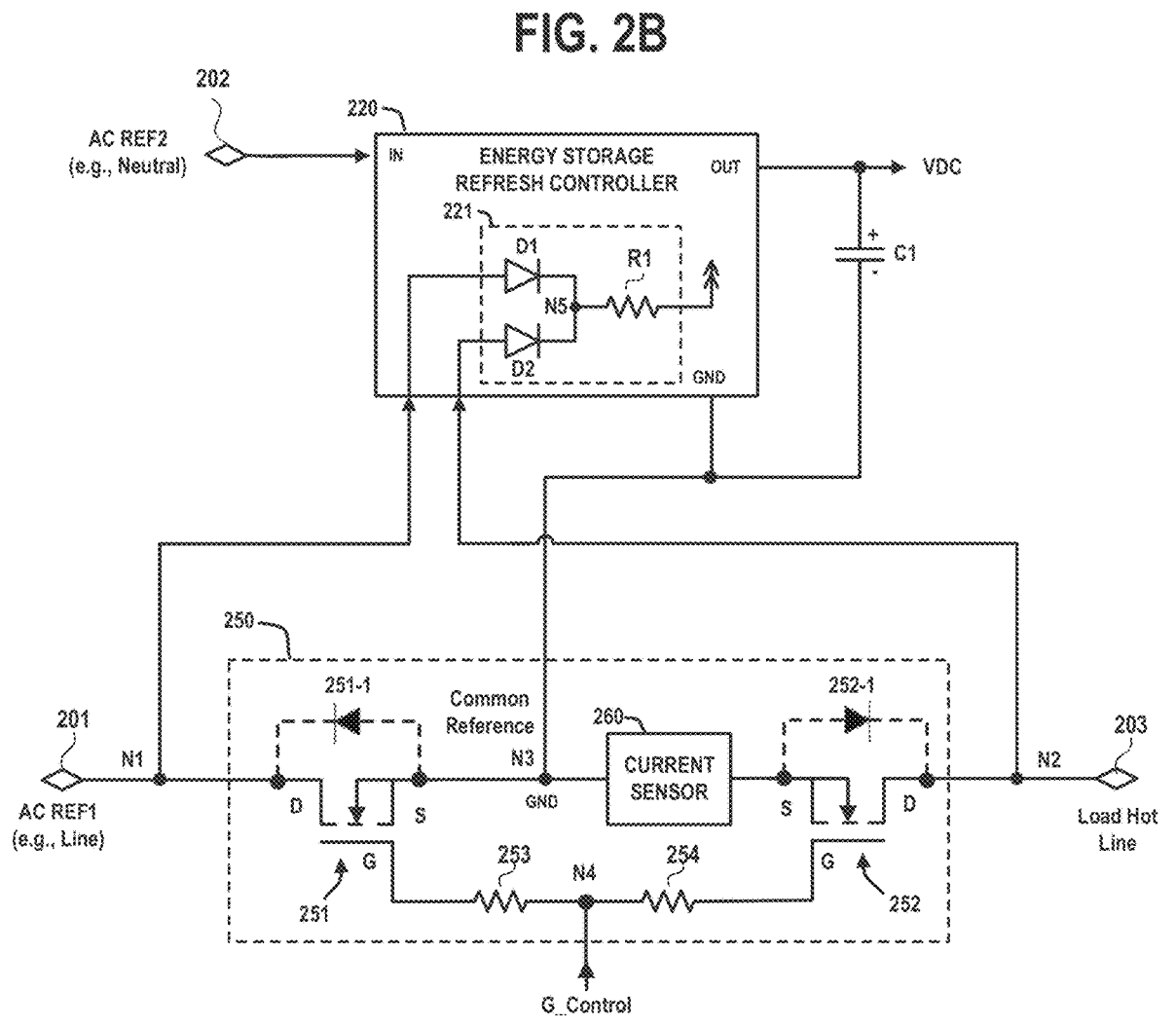

FIGS. 2A and 2B schematically illustrate an electrical device which comprises DC power generation and control circuitry having a DC ground that is referenced to a common node connection of a bidirectional solid-state switch, according to another exemplary embodiment of the disclosure. In general, FIG. 2A schematically illustrates an electrical device 200 which has an architecture that is similar to the architecture of the electrical device 100 of FIG. 1, but which further implements voltage and/or current sensor circuitry to sense load current and AC voltage, and utilize the sensed load current and/or AC voltage to perform intelligent control functions. In particular, the electrical device 200 comprises a first terminal 201, a second terminal 202, a third terminal 203, and a DC power generation and control system 210 which comprises passive components 212, an energy storage refresh controller 220 (alternatively, ERC 220) and associated storage capacitor C1 (alternatively $C_{ERC}$), AC voltage measurement circuitry 222 (alternatively, voltage sensor circuitry), DC-to-DC conversion circuitry 230 and 232, a controller 240, and AC switch driver circuitry 242. The electrical device 200 further comprises a solid-state AC switch 250, a current sensor 260, and one or more optional external DC-powered components including, for example, user control elements (e.g., slider, toggle switches, buttons, etc.) and status LEDs 270, a controller 280, and additional user control elements and status LEDs 282.

Similar to the embodiment of FIG. 1, the solid-state AC switch 250 is a bidirectional solid-state switch comprising a first solid-state switch 251 and a second solid-state switch 252, which are serially connected between a first node N1 and a second node N2, and which are coupled back-to-back to a third node N3. The third node N3 is a common node of the solid-state AC switch 250, which serves as a DC ground (GND) reference node for DC power generation, as well as the DC-powered control circuitry and components of the electrical device 200. In the exemplary embodiment of FIG. 2A, the solid-state AC switch 250 comprises a bidirectional MOSFET switch in which the first and second solid-state switches 251 and 252 comprise power MOSFET devices, e.g., N-type enhancement MOSFET devices, having respective gate terminals (G), drain terminals (D), and source terminals (S). In other embodiments, the solid-state AC switch 250 can be implemented using other types of transistor devices as discussed above.

The gate (G) terminals of the first and second solid-state switches 251 and 252 are commonly connected to a node N4 through respective current limiting resistors 253 and 254. In an optional alternative embodiment, the gate (G) terminals of the first and second solid-state switches 251 and 252 are additionally commonly connected to a node N4' through respective current limiting resistors 255 and 256. In this configuration, the solid-state AC switch 250 can be driven by different gate control signals G_Con1 and G_Con2 under different operating conditions. For example, the first gate control signal G_Con1 can be utilized to drive the solid-state AC switch 250 under normal operating conditions (e.g., modulating the ON/OFF time of the solid-state AC switch 250 for light dimming). On the other hand, the second gate control signal G_Con2 can be utilized to (i) respond rapidly to a fault event (e.g., short-circuit at the load side of the solid-state AC switch 250) and (ii) turn-off the solid-state AC switch 250 faster, i.e., drive the gate "harder" or faster to 0V in comparison to the turn-off speed of the solid-state AC switch 250 during normal operation. The solid-state AC switch 250 can be turned off faster either based on the gate driver circuitry or based on the value of current limiting resistors 255 and 256, or both.

In general, the DC power generation and control system 210 comprises various electronic components and circuitry to generate DC power from AC power and utilize the DC power to operate control circuitry of the electrical device 200. As with the exemplary embodiment of FIG. 1 discussed above, the DC power generation and control system 210 comprises an integrated package structure (or core system) that can be utilized in various types of intelligent electrical devices to provide DC power and some or all of the control logic and functionality for operating the solid-state AC switch 250 and other components of the electrical device. The DC power generation and control system 210 may comprise a SoC device or SIP device, etc., wherein the solid-state AC switch 250 and external DC-powered components 270, 280, and 282 are operatively coupled to (and packaged together with) the DC power generation and control system 210. Alternatively, the DC power generation and control system 210 can be comprised of discrete components in the form of a circuit board.

The energy storage refresh controller 220 is configured to utilize AC power (which is applied to the first and second terminals 201 and 202) to generate a voltage VDC having a programmable maximum voltage VDC_max (e.g., 60V). In some embodiments, the energy storage refresh controller 220 comprises circuitry to control the operation of a MOSFET which serves as a current source to periodically transfer energy from the AC power source and charge the storage capacitor C1 (or $C_{ERC}$) to the maximum DC voltage VDC_max.

The voltage VDC of the storage capacitor C1 is simultaneously applied to inputs (IN) of the DC-to-DC conversion circuitry 230 and 232, which are configured to generate regulated DC voltages. As the storage capacitor C1 releases/discharges storage energy to the loads over time, resulting in a voltage decrease from the maximum voltage VDC_max, the energy storage refresh controller 220 is configured to detect when the voltage VDC across the storage capacitor C1 reaches a minimum voltage, VDC_min, and then operates to recharge the storage capacitor C1 to VDC_max. The maximum DC voltage (VDC_max) and the minimum DC voltage (VDC_min) across the storage capacitor is tightly controlled by the energy storage refresh controller 220, wherein the MOSFET current source is turned on prior to charging the storage capacitor C1 so there is no gate switching of the MOSFET at beginning or during the charge operation, thereby improving efficiency. Exemplary embodiments of the energy storage refresh controller 220 will be discussed below in conjunction with FIGS. 4A, 4B, 4C, 5A, 5B, and 6.

The DC-to-DC conversion circuitry 230 is configured to convert the voltage VDC into one or more regulated DC rail voltages that are used as DC supply voltages to operate the controller 240, the user control elements and status LEDs 270, and the optional external DC-powered components, e.g., the controller 280 and the additional user control elements and status LEDs 282. In some embodiments, the DC-to-DC conversion circuitry 230 comprises one or more DC-DC step-down voltage switching regulator circuits (e.g., Buck switching regulators), or linear regulators, which are configured to convert the voltage VDC into or more regulated DC rail voltages with different voltage levels. In some embodiments, the DC-to-DC conversion circuitry 230 is configured to convert the voltage VDC into, e.g., one or more industry standard DC voltages including, but not limited to 12V, 10V, 5V, 3.3V, 2.5V, 2.7V, 1.8V, etc., as needed, depending on the DC supply voltage requirements of the controller 240 and the other DC-powered components 270, 280, and 282.

In some embodiments, the controller 240 outputs a digital control signal to program the DC-to-DC conversion circuitry 230 to output one or more regulated DC rail voltages as desired. This is particularly relevant in embodiments where the DC power generation and control system 210 comprises a core system with core functions that can utilized, or otherwise customized as needed, for a given application via operation of the controller 280, and other external components 270 and 282, which may be subsequent coupled to the core DC power generation and control system 210 and require different supply voltages for operation. In this regard, the core DC power generation and control system 210 can be configured to generate any number of different DC operating voltages for the internal DC-powered components of the core system, and the external DC-powered components 270, 280, and 282, which may be coupled to the core DC power generation and control system 210, for a given application.

The DC-to-DC conversion circuitry 232 is configured to generate a driver supply voltage for the AC switch driver circuitry 242. For example, in some embodiments, the DC-to-DC conversion circuitry 232 is configured to output a regulated DC voltage, e.g., 12 V or 10V, etc., which is specifically utilized by the AC switch driver circuitry 242 to generate the gate control voltage G_Con1 and the optional gate control voltage G_Con2 for driving the solid-state AC switch 250.

The controller 240 is configured to intelligently control various functions and operations of the electrical device 200. For example, in some embodiments, the controller 240 comprises one or more hardware processors (e.g., CPU, microcontroller, digital signal processor (DSP), FPGA, etc.) which is/are configured to execute logic to perform various intelligent control operations depending on the device type (e.g., dimmer switch, circuit breaker, circuit interrupter, etc.) of the electrical device 200. More specifically, in some embodiments, the controller 240 is configured to generate and apply control signals to a control input port C_IN of the AC switch driver circuitry 242 which, in turn, causes the AC switch driver circuitry 242 to generate the requisite gate control signals to control the operation of the solid-state AC switch 250.

The AC voltage measurement circuitry 222 is configured to sense/detect the AC voltage, generate analog voltage sense signals, and apply the analog voltage sense signals to one or more voltage sense (V_Sense) input ports of the controller 240. In some embodiments, the controller 240 comprises analog-to-digital converter (ADC) circuitry which is configured to digitize the analog voltage sense signals that are generated by the AC voltage measurement circuitry 222, and process the digitized voltage sense signals (using digital logic and algorithms) to perform AC voltage measurements and other voltage sensing/detection functions, as needed, to implement target functions for controlling the solid-state AC switch 250. For example, for protective functions, the controller 240 can be configured to perform AC voltage measurement to detect for the occurrence of fault conditions including, but not limited to, over-voltage conditions, surges in the AC voltage input, etc., and in response, generate a control signal to cause the AC switch driver circuitry 242 to turn off the solid-state AC switch 250 or otherwise temporarily modulate the ON/OFF time of the solid-state AC switch 250 during a temporary AC power surge to thereby regulate/modulate the amount of AC power that is delivered to the load and prevent damage due to the temporary AC power surge.

Furthermore, for dimming applications, the controller 240 can be configured to perform AC voltage measurements to detect zero-voltage crossings of the AC voltage waveform and an associated transition direction of the zero-voltage crossings, e.g., a transition from a neutral negative cycle of $V_{NL}$ to a neutral positive cycle of $V_{NL}$, or a transition from a neutral positive cycle of $V_{NL}$ to a neutral negative cycle of $V_{NL}$. In some embodiments, the detected zero-voltage crossings and associated transition directions are utilized by the controller 240 to generate control signals at proper times to control the switching functions (ON/OFF control) of the solid-state AC switch 250, e.g., modulate the ON/OFF timing of the solid-state AC switch 250 for light dimming applications or otherwise regulate power to a load for, e.g., motor speed control, thermal control of an electric heater, etc.

The current sensor 260 is configured to sense/detect the current flow (e.g., load current) through the solid-state AC switch 250, and generate analog current sense signals, and apply the analog current sense signals to one or more current sense (I_Sense) input ports of the controller 240. In some embodiments, the controller 240 comprises ADC circuitry which is configured to digitize the analog current sense signals that are generated by the current sensor 260, and process the digitized current sense signals (using digital logic and algorithms) to perform AC current measurements and other current sensing/detection functions, as needed, to implement target functions for controlling the solid-state AC switch 250. For example, for protective functions, the controller 240 can be configured to perform AC current measurements to detect for the occurrence of fault conditions including, but not limited to, over-current conditions, short-circuit conditions, etc., and in response, generate a control signal to cause the AC switch driver circuitry 242 to turn off the solid-state AC switch 250, in response to the detection of a fault condition.

The current sensor 260 can be implemented using suitable techniques. For example, for direct current measurement techniques, the current sensor 260 can be a resistive element including, but not limited to, a current sense resistor, an inductor with DC resistance, a channel resistance ($R_{DS}$) of a transistor/MOSFET, current sensing power MOSFETs (e.g., Ratio Metric current sense MOSFETs), etc., wherein the resistive element has a relatively low resistance R which generates a voltage V based on the magnitude of the current I by the relation V=IR. In other embodiments, indirect current measurements can be implemented using, e.g., a current transformer, a Rogowski Coil, Hall Effect device. In one specific non-limiting exemplary embodiment, the current sensor 260 can be a resistor having a relatively low resistance, e.g., 100 milli-Ohms or less, which is serially connected between the ground reference node N3 and the source terminal of the second solid-state switch 252.

Similar to the exemplary embodiment of FIG. 1, the various components of the core DC power generation and control system 210 have ground (GND) terminals/nodes that are coupled to the ground reference node N3, wherein the node N3 is commonly coupled to the source (S) terminals of the first and second solid-state switches 251 and 252. Moreover, as shown in FIG. 2A, the user control elements and status LEDs 270 (or peripheral components 270), and the external DC-powered components 280 and 282 have ground (GND) terminals/nodes that are coupled to the ground reference node N3. In this regard, the DC voltages that are generated by the energy storage refresh controller 220 and the DC-to-DC conversion circuitries 230 and 232 are all ground referenced to the node N3. In addition, the ground GND terminals/nodes of all DC-powered control circuitry and electronic components are coupled to the ground reference node N3. As noted above, this allows the control circuitry to directly drive the solid-state AC switch 250 with the first and second gate control voltages G_Con1 and G_Con2 without the need for AC-DC isolation. In addition, this allows the core DC power generation and control system 210 to measure AC voltage, measure AC current, control the solid-state AC switch 250, and convert AC power to DC power, all without the need for AC-DC isolation. Any number of other functions (e.g., temperature sensor or other sensor measurements) by electronic components and devices supplied with DC power from the core DC power generation and control system 210 with the ground reference node N3 can be implemented without the need for AC-DC isolation when such functions operate using DC power that is referenced to the common node connection (e.g., common source connection) at node N3 between the first and second solid-state switches 251 and 252 of the solid-state AC switch 250.

The common connection at node N3 between the first and second solid-state switches 251 and 252 of the solid-state AC switch 250 is utilized as a common DC reference, irrespective of the state (ON or OFF) of the solid-state AC switch 250. For example, as explained in further detail below, when the solid-state AC switch 250 is turned off, a current path exists from one terminal of the AC power source, through the core DC power generation and control system 210 (e.g., through the AC voltage measurement circuitry 222), through the body diode of one of the solid-state switching devices, and to the other terminal of the AC power source. If the first and second solid-state switches 251 and 252 do not have body diodes, then discrete diodes can be coupled in parallel to first and second solid-state switches 251 and 252.

Furthermore, similar to the exemplary embodiment of FIG. 1, the electrical device 200 of FIG. 2A implements "line-load swap" configuration, wherein the energy storage refresh controller 220 comprises input terminals that are coupled to the first terminal 201 (node N1), the second terminal 202 (neutral N node), and the third terminal 203 (node N2). The "line-load swap" configuration allows the AC power (e.g., line (L) phase) to be connected to either the first terminal 201 (node N1) or the third terminal 203 (node N3), and the load hot line of the load to be connected to either the third terminal 203 or first terminal 201. This allows the energy storage refresh controller 220 to be properly coupled to the AC power (e.g., line L and neutral N) and thereby generate the DC voltage VDC upon initial power-up of the electrical device 200 (e.g., when first connected to the AC power source 10) and during real-time operation, irrespective of whether the AC power (e.g., line L phase) is coupled to the first terminal 201 (node N1) or the third terminal 203 (node N2). Alternatively, if "line-load-swap" is not needed, the connections between the AC voltage measurement circuitry 222 and the node N2, and between the energy storage refresh controller 220 and the node N2, are not needed.

In some embodiments, the energy storage refresh controller 220 comprises circuitry which is configured to detect, upon power-up, which of the nodes N1 or N2 is connected to the AC power (e.g., line L phase), and then perform AC-to-DC conversion and other operations accordingly. For example, FIG. 2B schematically illustrates a circuit 221 which is implemented by the energy storage refresh controller 220 to support a line-load swap configuration, according to an exemplary embodiment of the disclosure. The circuit 221 comprises a first diode D1, a second diode D2, and a resistor R1. The first diode D1 comprises an anode terminal coupled to the node N1, and the second diode D2 comprises an anode terminal coupled to the node N2. The first and second diodes D1 and D2 have cathode terminals that are commonly connected at node N5, and the resistor R1 comprises one terminal which is coupled to node N5, and a second terminal which, as explained in further detail below, is coupled to an internal node (not shown) of the energy storage refresh controller 220.

The circuit 221 essentially operates as diode OR circuit. For example, in an exemplary configuration where the hot line L of the AC power is coupled to the first terminal 201 (node N1) and load hot line is coupled to the third terminal 203 (node N2), upon power-up of the electrical device 200 (i.e., AC power is initially applied to the electrical device 200), the first diode D1 will be forward-biased such that current will flow through the first diode D1 and the second diode D2 will be reversed-biased. On the other hand, when the hot line L of the AC power is coupled to the third terminal 203 (node N2) and load hot line is coupled to the first terminal 201 (node N1), upon power-up of the electrical device 200 (i.e., AC power is initially applied to the electrical device 200), the second diode D2 will be forward-biased such that current will flow through the second diode D2 and the first diode D1 will be reversed-biased. In this regard, the diode OR circuit 221 allows the line L voltage to be applied to the energy storage refresh controller 220 upon initial power-up of the electrical device 200 irrespective of the line and load connections to the first and third terminals 201 and 203.

Moreover, referring back to FIG. 2A, the AC voltage measurement circuitry 222 comprises input terminals that are coupled, respectively, to the first terminal 201 (node N1), the second terminal 202 (neutral N node), and the third terminal 203 (node N2). The circuit architecture of the AC voltage measurement circuitry 222 will vary depending on whether or not the core DC power generation and control system 210 supports a "line-load swap" configuration or not. An exemplary embodiment of the AC voltage measurement circuitry 222 which does not support line-load swapping will be discussed below in conjunction with FIG. 3A, while an exemplary embodiment of the AC voltage measurement circuitry 222 which does support line-load swapping will be discussed below in conjunction with FIG. 3B.

It is to be noted that the electrical device 200 shown in FIGS. 2A and 2B can be one of various types of intelligent electrical devices including, but not limited to, an intelligent solid-state circuit breaker, an intelligent circuit interrupter, an intelligent light switch to provide dimming control for lighting, an intelligent switch to regulate power to various types of loads (e.g., fans, motors), etc. In some embodiments, the core DC power generation and control system 210 can designed as a universal modular component that can be utilized for various applications, where the core DC power generation and control system 210 provides basic functionalities of DC power generation and controlling the solid-state AC switch 250. The core DC power generation and control system 210 is configured to provide DC power to the external DC power components 270, 280, and 282, which can vary depending on the device type of the electrical device 200.

The controller 280 can be configured to communicate with the controller 240 (via a communication interface, denoted "Comm") to implement custom control functions depending on the device type of the electrical device 200. The core DC power generation and control system 210 generates all the DC voltages needed to power all internal and external components. The controller 280 (e.g., microcontroller) can be coupled to (and packaged together with) with the core DC power generation and control system 210 and programmed to interface and communicate with the controller 240, wherein control logic functions would be shared between internal and external control logic of the controllers 240 and 280. The controller 240 could provide basic and default control functions for, e.g., a dimmer application, while the controller 280 can implement control logic to implement custom functions, e.g., set dimming level, set ramp rate (when the "on" button is selected, light brightness incrementally increases from off to a certain brightness at a certain rate), etc. For example, the controller 280 can be custom programmed to request a 5 second ramp rate, and the controller 240 would operate according to the commands/requests of the controller 280.

It is to be appreciated that there are various advantages associated with the core DC power generation and control system 210 shown in FIG. 2A. For example, the use of the common node connection at node N3 as a DC ground reference node eliminates the need to implement AC-DC isolation to drive the solid-state AC switch 250. In addition, such isolation is not needed to perform the current and/or voltage measurements through the solid-state AC switch 250. The ability to eliminate AC-DC isolation allows for a higher level of circuit integration in comparison with a system requiring such isolation. The core DC power generation and control system 210 can be implemented with only one substrate when implemented in an integrated circuit, thereby improving manufacturability, reliability and decreasing size. Indeed, by eliminating the need to use transformers for AC-DC isolation, the core DC power generation and control system 210 can be highly integrated with a small footprint.

Further, the core DC power generation and control system 210 is configured to provide sufficient DC power to operate all internal components of the core DC power generation and control system 210 and all external DC-powered components that are coupled to the core DC power generation and control system 210. A device manufacturer can utilize the core DC power generation and control system 210 to manufacture electrical devices with solid-state AC switches (e.g., dimmers, circuit breakers, etc.) and rely on the DC power generation of the core DC power generation and control system 210 to supply DC power to any and all external DC-powered components that the manufacture may package with the core DC power generation and control system 210.

Figure 3A:
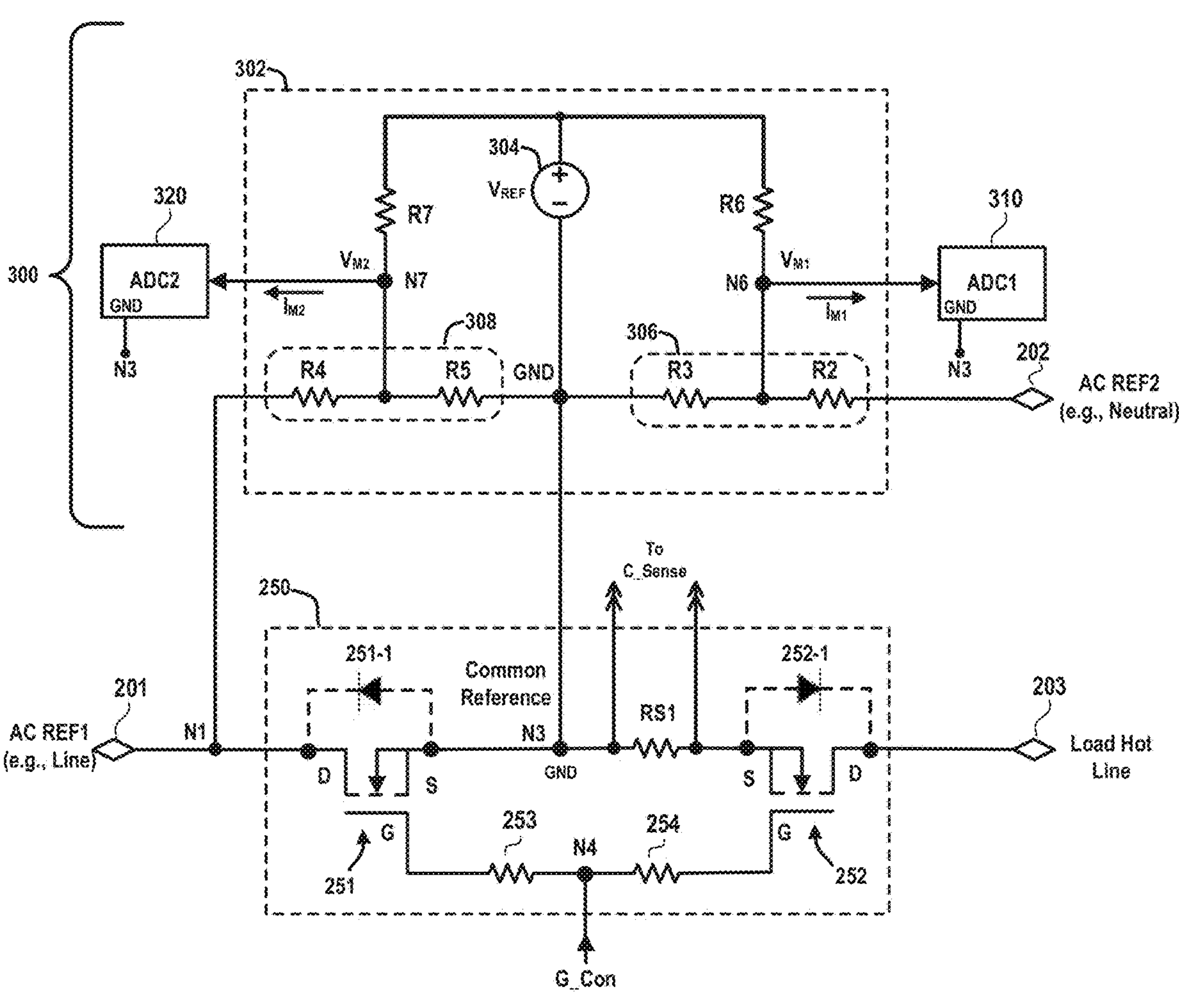
FIG. 3A schematically illustrates AC voltage measurement circuitry for implementation with a non-line-load swap architecture, according to an exemplary embodiment of the disclosure.

FIG. 3A schematically illustrates AC voltage measurement circuitry, according to an exemplary embodiment of the disclosure. In particular, FIG. 3A schematically illustrates AC voltage measurement circuitry 300 which can be implemented with, e.g., the DC power generation and control system 210 of FIG. 2A having a non-line-load swap architecture. As noted above, in the non-line-load swap architecture, the first terminal 201 (node N1) is coupled to the AC voltage measurement circuitry 222 and the energy storage refresh controller 220, while the third terminal 203 (node N2) is not coupled to the AC voltage measurement circuitry 222 or the energy storage refresh controller 220. In the non-line-load swap architecture shown in FIG. 3A, the first terminal 201 (node N1) is connected to the AC power source (e.g., line L phase) while the third terminal 203 is coupled to the load hot line, and the AC voltage measurement circuitry 300 is coupled to only the first and second terminals 201 and 202, and not to the third terminal 203. In addition, for purposes of illustration, FIG. 3A illustrates an exemplary embodiment of the solid-state AC switch 250 in which the current sensor 260 is implemented using a current sense resistor RS1 coupled to and between the ground reference node N3 and the source (S) terminal of the second solid-state switch 252.

As shown in FIG. 3A, the AC voltage measurement circuitry 300 comprises an AC voltage sensor circuit 302, a first ADC circuit 310, and a second ADC circuit 320. The AC voltage sensor circuit 302 comprises a plurality of resistors R2, R3, R4, R5, R6, and R7, and a reference voltage 304 ($V_{REF}$). The resistors R2 and R3 are serially connected between the second terminal 202 and the ground node N3. The resistors R4 and R5 are serially connected between the first terminal 201 (node N1) and the ground node N3. The resistors R2 and R3 form a first resistive voltage divider 306 to measure the neutral N voltage at the second terminal 202. In particular, the first resistive voltage divider 306 generates a voltage at node N6 which is a fraction of the neutral N voltage at the second terminal 202. Similarly, the resistors R4 and R5 form a second resistive voltage divider 308 to measure the line L voltage at the first terminal 201 (node N1). In particular, the second resistive voltage divider 308 generates a voltage at node N7 which is a fraction of the line L voltage at the first terminal 201 (node N1).

The voltage at node N6 is pulled up by a resistor R6 and the reference voltage 304 such that a measured voltage $V_{M1}$ at node N6 remains in a voltage range of [0V, $V_{REF}$]. The measured voltage $V_{M1}$ at node N6 represents the Neutral-to-GND voltage. Similarly, the voltage at node N7 is pulled up by resistor R7 and the reference voltage 304 such that a measured voltage $V_{M2}$ at node N7 remains in a voltage range of [0V, $V_{REF}$]. The measured voltage $V_{M2}$ at node N7 represents the Line-to-GND voltage. The measured voltage $V_{M1}$ at node N6 is applied to the input of the first ADC circuit 310 and digitized. The measured voltage $V_{M2}$ at node N7 is applied to the input of the second ADC circuit 320 and digitized. This configuration avoids the need to measure negative voltages at nodes N6 and N7. It is to be noted that $I_{M1}$ and $I_{M2}$ represent input bias currents that flow into the inputs of the first and second ADC circuits 310 and 320, respectively. The input bias currents $I_{M1}$ and $I_{M2}$ are constants that are based on the hardware design.

The reference voltage 304 comprises a constant DC voltage $V_{REF}$ which is generated by the core DC power generation and control system 210 of FIG. 2A. In some embodiments, the DC voltage $V_{REF}$ is generated by the DC-to-DC conversion circuitry 230. In some embodiments, the DC voltage $V_{REF}$ is an internal DC voltage that is generated by the energy storage refresh controller 220, the details of which will be explained in further detail below in conjunction with, e.g., FIGS. 4A and 4B. In some embodiments, the DC voltage $V_{REF}$ is 3.3 V or 5.0 V, etc.

In operation, the AC voltage sensor circuit 302 generates the analog voltage measurements $V_{M1}$ and $V_{M2}$ which measure the neutral and line voltage, respectively, both in reference to the ground reference node N3. The first and second ADC circuits 310 and 320 digitize the analog voltage measurements $V_{M1}$ and $V_{M2}$, respectively, and the controller 240 (FIG. 2A) processes the digitized voltage measurements $V_{M1}$ and $V_{M2}$ using an algorithm and mathematical analysis to combine the digitized voltage measurements $V_{M1}$ and $V_{M2}$ and measure the full AC voltage waveform, $V_{NL}$=Neutral-to-Line voltage.

For example, in an exemplary embodiment, the controller 240 implements algorithms to compute $V_{NL}$ based on parameters such as the voltage $V_{REF}$, the digitized voltage measurements $V_{M1}$ and $V_{M2}$, the input bias currents $I_{M1}$ and $I_{M2}$, and the values of the resistors R2, R3, R4, R5, R6, and R7. More specifically, in an exemplary embodiment, the controller 240 computes $V_{NL}$ as follows: $V_{NL}\ a \cdot V_{M1} - b \cdot V_{M2} + c$, where a, b and c are constants that are determined as functions of the resistors R2, R3, R4, R5, R6, and R7, the DC voltage $V_{REF}$, and the input bias currents $I_{M1}$ and $I_{M2}$.

For example, in an exemplary embodiment, the constants a, b and c are determined as follows:

$$a = 1 + \frac{R2}{R3} + \frac{R2}{R6},$$

$$b = 1 + \frac{R4}{R5} + \frac{R4}{R7}, \text{ and}$$

$$c = R2 \cdot I_{M1} + \frac{R4}{R7} \cdot V_{REF} - \frac{R2}{R6} \cdot V_{REF} - R4 \cdot U_{M2}.$$

Furthermore, the resistor values R2, R3, R4, R5, R6, and R7 are selected to obtain the desired ranges of the measured analog voltages $V_{M1}$ and $V_{M2}$. The resistor values R2, R3, R4, R5, R6, and R7 are determined based on factors including, but not limited to, a desired maximum leakage current ($I_{Leak}$), a desired minimum ADC measurement voltage (not less than 0V), a desired maximum ADC measurement voltage.

With regard to the desired maximum leakage current, it is to be noted that in the exemplary embodiment of FIG. 3A, the resistors R4, R5, R3, and R2, which are serially connected between the line L and neutral N terminals, provide a current path that bypasses the solid-state AC switch 250, which results in leakage current to the load when the solid-state AC switch 250 is turned off. For example, during positive half-cycles of the AC power (i.e., when $V_{NL}$ is negative), a current leakage path exists from node N1 (line L), through resistors R4 and R5, to node N3, the small sense resistor RS1, through the body diode 252-1 of the second solid-state switch 252, to the load, and return to neutral N. However, the maximum amount of leakage current can be limited by, e.g., selecting the resistance values of R2 and R4 to be on the order of megaohms.

For example, in some embodiments, the resistance values of R2 and R4 are selected based on a maximum desired leakage current $I_{Leak}$ and peak-to-peak AC voltage $V_{AC\_Peak}$ as follows:

$$R2 = R4 = \frac{V_{AC\_Peak}}{I_{Leak}},$$

where $V_{AC\_Peak} = \sqrt{2} \cdot V_{AC\_RMS}$. In an exemplary embodiment where $V_{AC\_RMS}$=240V, then $V_{AC\_Peak}$=339.4 V. Further, assuming a maximum desired leakage current $I_{Leak} \leq 40$ μA, then R2 and R4 can be selected to have a resistance value of about 8.5 megaohms or greater (e.g., 10 megaohms). It is to be noted that a leakage current of 40 μA is acceptable for light dimmer devices. However, for circuit breaker applications, the leakage current of 40 μA can result in a relatively large voltage drop across a high resistance load. In such instances, an isolation circuit can be coupled between the load hot and load neutral lines of the load to shunt the leakage current from the load.

Furthermore, with regard to selecting the resistance values of the resistors R3, R5, R6, and R7, the following equations may be considered as guidelines for determining the resistance values based on various parameters. For example, the resistance value of R6 can be determined as follows:

$$R6 = \frac{V_{REF} \cdot R2}{I_{M1} \cdot R2 + V_{AC_{Peak}} + V_{U1\_min\_pos}}.$$

The value of $V_{U1\_min\_pos}$ denotes a smallest positive voltage $V_{U1}$ of the first solid-state switch 251 when the AC switch 250 is turned ON and $V_{NL}=-V_{AC\_Peak}$. The value of $I_{M1}$ would likely be on the order of a nanoampere (e.g., 1 nA).

Moreover, the resistance value of R3 can be determined as follows:

$$R3 = \frac{V_{M1\_max}}{\frac{(V_{AC\_Peak} - V_{D1} - V_{M1\_max})}{R2} + \frac{(V_{REF} - V_{M1\_max})}{R6} - I_{M1}}.$$

The value $V_{D1}$ denotes the maximum forward voltage drop of the body diode 251-1 (e.g., about 0.3 V), and $V_{M1\_max}$ denotes a maximum ADC measurement voltage on node N6. Next, the resistance value of R7 can be determined as follows:

$$R7 = \frac{V_{REF}}{I_{M2} - \frac{V_{U1\_max\_neg}}{R4}}.$$

The value of $V_{U1\_max\_neg}$ denotes a largest negative voltage $V_{U1}$ of the first solid-state switch 251 when the AC switch 250 is turned ON and $V_{NL}$ $V_{AC\_Peak}$. Finally, in an exemplary embodiment, the resistance value of R5 can be determined as follows:

$$R5 = \frac{V_{M2\_max}}{\frac{(V_{AC\_Peak} - V_{D2} - V_{M2\_max})}{R4} + \frac{(V_{REF} - V_{M2\_max})}{R7} - I_{M2}}.$$

The value $V_{D2}$ denotes the maximum forward voltage drop of the body diode 251-2 (e.g., about 0.3 V), and $V_{M2\_max}$ denotes a maximum ADC measurement voltage on node N7.

As noted above, the constants a, b and c in the equation $V_{NL}=a \cdot V_{M1}-b \cdot V_{M2}+c$, are computed based at least in part on the resistance values for R2, R3, R4, R5, R6, and R7. Once the resistance values for R2, R3, R4, R5, R6, and R7 are determined for a given configuration of the AC measurement circuitry 300, the constants a, b and c are computed and utilized by the controller 240 to compute the full AC voltage waveform $V_{NL}$ based on the digitized ADC voltage measurements $V_{M1}$ and $V_{M2}$.

As noted above, in some embodiments such as shown in FIG. 3A, the sense resistor RS1 is utilized a current sensor device, wherein the controller 240 is configured to measure a voltage drop across the current sense resistor RS1 to determine a magnitude of current flowing through the solid-state AC switch 250 based on the measured voltage drops across the current sense resistor RS1. The sense resistor RS1 is selected to have a very small resistance value (e.g., 15 milli-Ohm), such that the voltage drop across the sense resistors RS1 is negligible but yet sufficient for current sensing.

It is to be noted that in the exemplary configuration of FIG. 3A, the placement of the sense resistor RS1 between the ground node N3 and the source (S) terminal of the second solid-state switch 252 is preferred to avoid a surge of current which flows from node N3 through the body diode 251-1 when the energy storage refresh controller 220 charges up the storage capacitor C1. If the sense resistor RS1 was connected between the ground reference node N3 and the source (S) terminal of the first solid-state switch 251, a surge of current would flow through the sense resistor RS1 during each period of time that the energy storage refresh controller 220 charges the storage capacitor C1. The current surge through the current sense resistor RS1 would negatively impact the current measurement through the solid-state AC switch 250 because the current measurement by the controller 240 would measure the actual load current plus the additional current being provided from the neutral N line to charge the storage capacitor C1 through energy storage refresh controller 220. This surge would occur every time the storage capacitor C1 is charged.

Figure 3B:
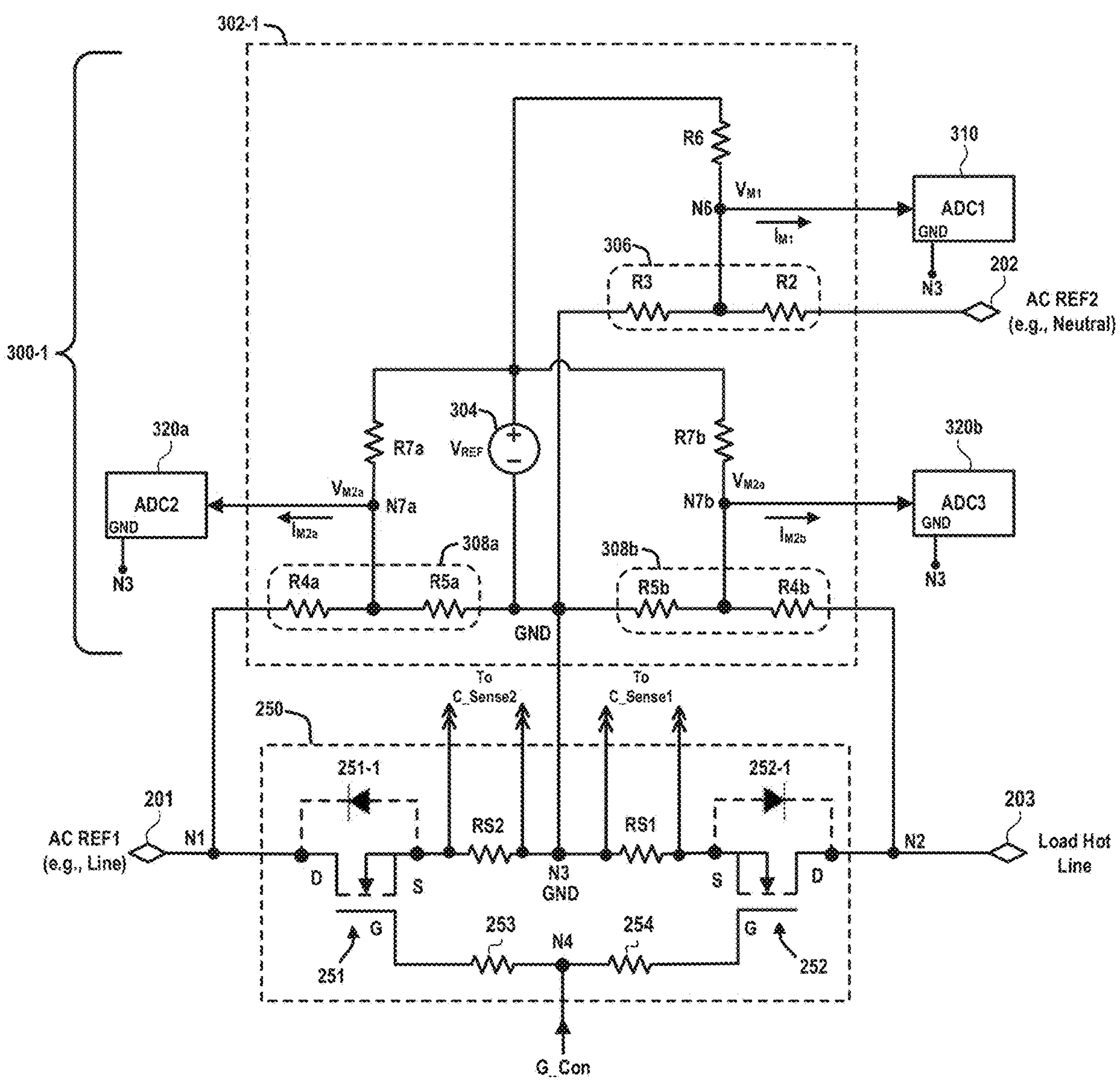
FIG. 3B schematically illustrates AC voltage measurement circuitry for implementation with a line-load swap architecture, according to an exemplary embodiment of the disclosure.

FIG. 3B schematically illustrates AC voltage measurement circuitry, according to another exemplary embodiment of the disclosure. In particular, FIG. 3B schematically illustrates AC voltage measurement circuitry 300-1 which can be implemented with, e.g., the DC power generation and control system 210 of FIG. 2A having a line-load swap architecture. As noted above, in the line-load swap architecture, both the first terminal 201 (node N1) and the third terminal 203 (node N2) are coupled to the AC voltage measurement circuitry 222 and the energy storage refresh controller 220, wherein the line L phase of the AC power source can be coupled to either the first terminal 201 (node N1) or the third terminal 203 (node N2), with the load hot line connected to the other terminals 203 or 201.

For purposes of illustration, FIG. 3B illustrates an exemplary embodiment where the line L phase of the AC power source is coupled to the first terminal 201 (node N1), while the load hot line is coupled to the third terminal 203 (node N2). Furthermore, for purposes of discussion, FIG. 3B schematically illustrates an exemplary embodiment in which the current sensor 260 (of FIG. 2A) is implemented using a current sense resistor RS1 coupled to and between the ground reference node N3 and the source (S) terminal of the second solid-state switch 252, and a current sensor resistor RS2 coupled to and between the ground reference node N3 and the source (S) terminal of the first solid-state switch 251.

As shown in FIG. 3B, the AC voltage measurement circuitry 300-1 comprises an AC voltage sensor circuit 302-1, and ADC circuits 310, 320*a*, and 320*b*. The AC voltage measurement circuitry 300-1 of FIG. 3B is similar in architecture and operation as the AC voltage measurement circuitry 300 of FIG. 3A, except that the AC voltage measurement circuitry 300-1 comprises duplicate line voltage measurement circuitry coupled to both nodes N1 and N2 to measure the line L voltage depending on which node N1 or N2 the line L phase of the AC power source is coupled to. In particular, as shown in FIG. 3B, the AC voltage sensor circuit 302-1 comprises the first resistive voltage divider 306 comprising the resistors R3 and R2, and the pull-up resistor R6 coupled to the reference voltage 304, which are configured to generate an analog measurement voltage $V_{M1}$ at node N6, to measure the neutral N voltage at the second terminal 202.

Furthermore, the AC voltage sensor circuit 302-1 comprises a second resistive voltage divider 308*a* comprising resistors R4*a* and R5*a*, and a pull-up resistor R7*a* coupled to the reference voltage 304, which are configured to generate an analog measurement voltage $V_{M2a}$ at node N7*a*, to measure the line L voltage at the first terminal 201, when the L phase of the AC power source is coupled to the first terminal 201. Similarly, the AC voltage sensor circuit 302-1 comprises a third resistive voltage divider 308*b* comprising resistors R4*b* and R5*b*, and a pull-up resistor R7*b* coupled to the reference voltage 304, which are configured to generate an analog measurement voltage $V_{M2b}$ at node N7*b*, to measure the line L voltage at the third terminal 203, when the L phase of the AC power source is coupled to the third terminal 203. In some embodiments, resistance values of R4a, R5a, and R7a are the same as the resistance values of R4b, R5b, and R7b, respectively.

It is to be noted that the same equations for computing the resistor values, the constants, $V_{NL}$, etc., for the non-line-load swap embodiment of FIG. 3A are the same equations used for computing the resistor values, the constants, $V_{NL}$, etc., for the line-load swap embodiment of FIG. 3B. During power-up, the controller 240 will determine which of the first terminal 201 or third terminal 203 the line L phase of the AC power source is coupled to, and utilize the line voltage measurement circuitry coupled either node N1 or node N2 accordingly, while ignoring the line voltage measurement circuitry coupled to the node N1 or N2 that is coupled to the load hot line. For example, during power-up, with the solid-state AC switch 250 in an Off state, when $V_{M1}$ is measured to be at the peak voltage, the controller 240 can measure $V_{M2a}$ at node N7a, and $V_{M2b}$ at node N7b, and then determine which node N1 or N2 the line L phase is connected to depending on which measurement $V_{M2a}$ or $V_{M2b}$ is measured to be 0V (i.e., the line voltage measurement circuitry with 0V at node N7a or N7b is deemed to be connected to the line L phase of the AC power source), and then ignore the other measurement during normal operation. For example, in the exemplary embodiment of FIG. 3B where the line L phase of the AC power source is coupled to the first terminal 201 (node N1) and the load hot line is coupled to the third terminal 203 (node N2), the controller 240 will utilize the ADC circuit 320a to digitize the analog line voltage measurement on node N7a, while essentially deactivating the ADC circuit 320b and ignoring the analog voltage on node N7b.

For the line-load swap embodiment shown in FIG. 3B where two sense resistors RS1 and RS2 are coupled between the source terminals of the first and second solid-state switches 251 and 252, the controller 240 can be configured to ignore the measured voltage drop across the current sense resistor (e.g., RS2) which is coupled to the line side of node N3, while measuring the voltage drop across the current sense resistor (e.g., RS1) which is coupled to the load side of node N3 to determine the current flow through the solid-state AC switch 250. In this configuration, the current sensing can avoid measuring current surges that occur through the solid-state AC switch 250 when the storage capacitor C1 is charged. In another exemplary embodiment of the line-load swap embodiment, one current sense resistor can be utilized, and the controller 240 can be configured to essentially filter out or otherwise ignore the extra surge current that is generated during charging of the storage capacitor C1, in an instance where the single current sense resistor is coupled to the line side of the node N3. Some type of feedback from the energy storage refresh controller 220 or algorithm can be used by the controller 240 to ignore the extra current surge current that flows through the solid-state AC switch 250 during each short duration (e.g., 100 microseconds current spike) when storage capacitor C1 is recharged by the energy storage refresh controller 220.

Figure 4A:
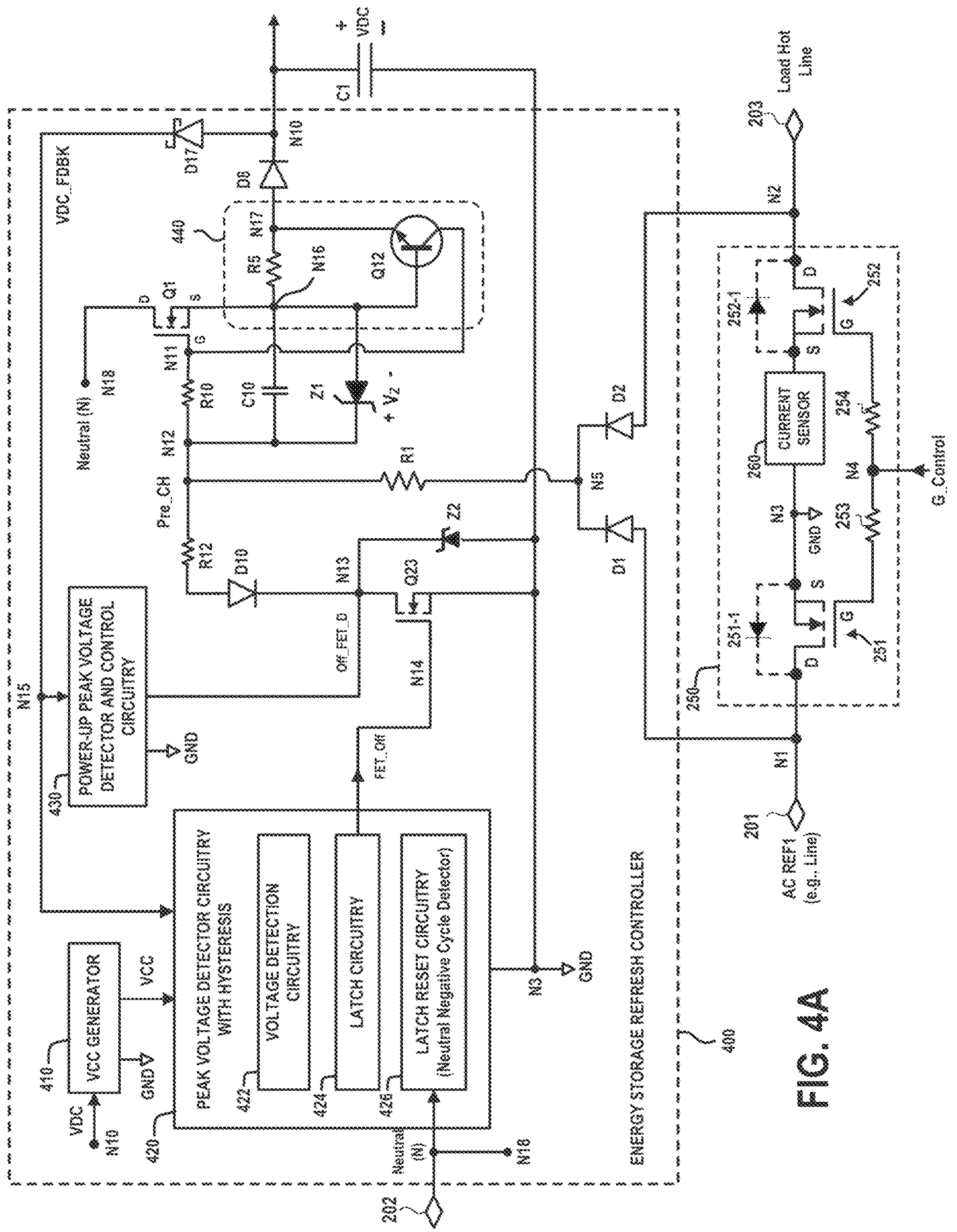
FIGS. 4A, 4B, and 4C schematically illustrate an energy storage refresh controller, according to an exemplary embodiment of the disclosure.
Figure 4B:
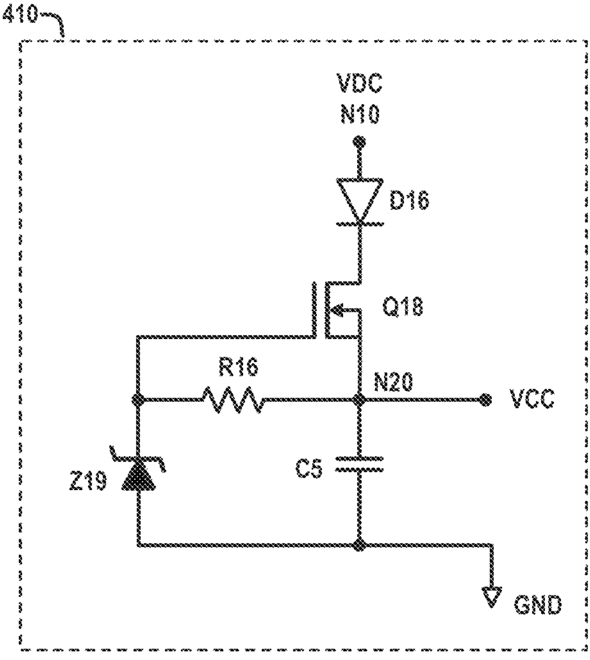
Figure 4C:
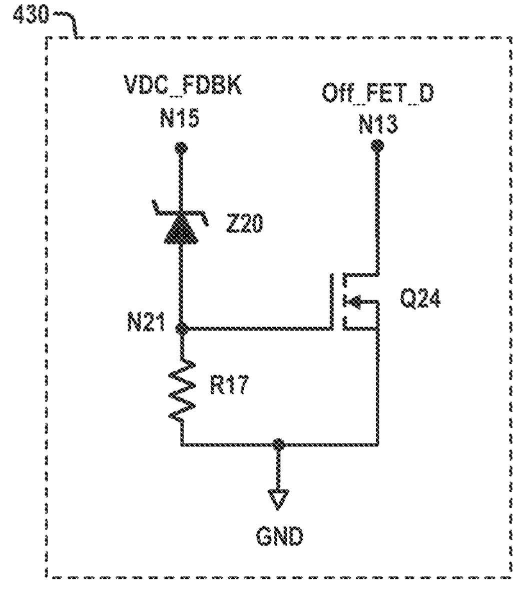

FIGS. 4A, 4B, and 4C schematically illustrate an energy storage refresh controller, according to an exemplary embodiment of the disclosure. In particular, FIG. 4A is a high-level schematic illustration of an exemplary embodiment of an energy storage refresh controller 400 (ERC 400), which can be implemented in the core DC power generation and control system 210 of FIG. 2A. For purposes of discussion and ease of illustration, FIG. 4A further depicts the solid-state AC switch 250 with a line-load swap configuration enabled by the diodes D1 and D2 and current limiting resistor R1 (or pull-up resistor), as discussed above in conjunction with FIG. 2A. Moreover, for purposes of illustration, FIG. 4A shows an embodiment in which the line L phase of the AC power source is applied to the first terminal 201 (node N1) and the load hot line is coupled to the third terminal 203 (node N2). In a non-line-load swap embodiment where the second diode D2 is not present, the line L phase of the AC power would need to be coupled to the first terminal 201 (node N1).

In general, the energy storage refresh controller 400 comprises VCC generator circuitry 410, peak voltage detector circuitry with hysteresis 420, power-up peak voltage detector and control circuitry 430, an optional current surge protection circuit 440, solid-state switches Q1 and Q23, diodes D8, D10, and D17, Zener diodes Z1 and Z2, resistors R10 and R12, and a capacitor C10. In addition, the energy storage refresh controller 400 comprises the diodes D1 and D2 and resistor R1, which support the line-load swap configuration. The peak voltage detector circuitry with hysteresis 420 (or peak voltage detector circuitry 420) comprises voltage detection circuitry 422, latch circuitry 424, and latch reset circuitry 426. The optional current surge protection circuit 440 comprises a switch Q12 (e.g., NPN bipolar junction transistor) and a resistor R5.

The energy storage refresh controller 400 is configured to control the charging of the storage capacitor C1. The storage capacitor C1 is coupled between an output node N10 of energy storage refresh controller 400 and the DC ground reference node N3. As noted above, the voltage VDC across the storage capacitor C1 is applied to one or more DC-DC converters to generate one or more target supply voltages. The storage capacitor C1 is charged by current which is provided by the solid-state switch Q1. The solid-state switch Q1 is operated as a current source to charge the storage capacitor C1 under certain conditions, as explained in further detail below. In some embodiments, the solid-state switch Q1 comprises an N-type MOSFET device having a drain terminal coupled to the neutral N line (e.g., second terminal 202) at node N18, a gate terminal coupled to node N11, and a source terminal coupled to node N16.

As schematically illustrated in FIG. 4A, the resistor R10 is connected between nodes N11 and N12. The capacitor C10 and the Zener diode Z1 are coupled in parallel between the nodes N12 and N16. In an alternate embodiment, the capacitor C10 and the Zener diode Z1 can be coupled between nodes N11 and N16 to help reduce ringing or noise at node N11. The capacitor C10 and the Zener diode Z1 are configured to implement a driver circuit that is configured to self-generate a regulated voltage across the nodes N12 or N11, and N16 using current drawn from the AC power source, wherein the regulated voltage is utilized to drive the solid-state switch Q1. For example, during a positive half-cycle of the input AC power (when $V_{NL}$ is negative), current flows from the node N1 along a path which comprises the diode D1, the resistor R1, the capacitor C10, a forward-biased body diode of the solid-state switch Q1, and to the neutral node N18 back to the neutral N line. This current flow causes a voltage across the capacitor C10 to increase until the capacitor voltage reaches a Zener voltage (denoted $V_Z$) of the Zener diode Z1. The Zener voltage (e.g., $V_Z$=10V or greater) of Z1 provides a regulated gate-to-source voltage ($V_{GS}$) to drive the solid-state switch Q1 to generate a charging current for charging the storage capacitor C1 to the maximum DC voltage $V_{DC}$_max, as needed. In this exemplary configuration, the Zener diode Z1 serves to clamp the voltage $V_{GS}$ of the solid-state switch Q1 to the Zener voltage $V_Z$ of the Zener diode Z1. As explained in further detail below, the solid-state switch Q1 can be deactivated by activating the solid-state switch Q23, wherein activation of the solid-state switch Q23 causes the voltage across the capacitor C10 to discharge to a level which is below the turn-on voltage $V_{GS}$ of the solid-state switch Q1.

The VCC generator circuitry 410 is configured to generate an internal power supply voltage VCC using the voltage VDC on the output node N10. As schematically illustrated in FIG. 4A, the VCC generator circuitry 410 comprises an input terminal that is coupled to the output node N10 to receive the VDC voltage. The power supply voltage VCC is utilized to provide DC power to the components of the peak voltage detector circuitry 420. In some embodiments, the VCC generator circuitry 410 is configured to generate a power supply voltage VCC=5.0V (for a 5V logic architecture). In other embodiments, the VCC generator circuitry 410 is configured to generate a power supply voltage VCC which is greater than 5.0V, e.g., 16 V, wherein the voltage level of VCC can vary to enable enhanced immunity to noise, as will be discussed in further detail below. An exemplary embodiment of the VCC generator circuitry 410 will be discussed in conjunction with FIG. 4B.

In general, the energy storage refresh controller 400 implements a control protocol that is configured to control the charging of the storage capacitor C1 to a maximum DC voltage, VDC_max (wherein the voltage VDC_max is predetermined based on design parameters), and recharge the storage capacitor C1 to VDC_max when the voltage VDC across the storage capacitor C1 is determined to decrease to a minimum threshold voltage VDC_min. More specifically, the peak voltage detector circuitry 420 is configured to monitor the voltage VDC at the output node N10 to determine occurrences of (i) when the voltage VDC across the storage capacitor C1 has reached a maximum peak voltage VDC_max during a charging operation, and (ii) when the voltage VDC of the storage capacitor C1 has decreased to or below the minimum voltage VDC_min.

The peak voltage detector circuitry 420 implements hysteresis to prevent the storage capacitor C1 from being charged every neutral positive cycle under, e.g., low load conditions, when the voltage VDC of the storage capacitor C1 is less than VDC_max by only a small amount (e.g., less than VDC_max by some voltage differential that is less than a hysteresis voltage V_Hyst). This prevents the charging transistor Q1 from being turned on, and wasting power, in instances when the voltage VDC of the storage capacitor C1 is slightly less than VDC_max. In this regard, during real time operation, the voltage VDC across the storage capacitor C1 (at node N10) resembles a triangular-shaped waveform which fluctuates between the maximum voltage VDC_max and the minimum voltage VDC_min based on the hysteresis voltage V_Hyst of the peak voltage detector circuitry 420, e.g., wherein VDC_min=VDC_mx less V_Hyst. For example, in an exemplary non-limiting embodiment, VDC_max=60V, VDC_min=58V, and V_Hyst=2V.

As schematically illustrated in FIG. 4A, the peak voltage detector circuitry 420 is configured to monitor the voltage VDC at the output node N10 by receiving a feedback voltage (denoted VDC_FDBK) through a feedback path comprising the diode D17. The diode D17 comprises an anode terminal coupled to node N10 and a cathode terminal coupled to feedback node N15. The feedback node N15 is coupled to a feedback input node of the peak voltage detector circuitry 420, as well as a feedback input node of the power-up peak voltage detector and control circuitry 430. In some embodiments, the diode D17 comprises a Schottky diode. The feedback voltage VDC_FDBK corresponds to the magnitude of the voltage VDC across the storage capacitor C1, at any given time, less the relatively small voltage drop across the diode D17.

The peak voltage detector circuitry 420 generally operates as follows. The voltage detection circuitry 422 is configured to monitor the feedback voltage VDC_FDBK to determine the magnitude of the voltage VDC across the storage capacitor C1 at node N10. The peak voltage detector circuitry 420 generates control signals to control the operation of the latch circuitry 424, depending on the determined magnitude of the voltage VDC at node N10. The latch circuitry 424 is responsive to control signals from the voltage detection circuitry 422 and the latch reset circuitry 426 to generate a control signal (denoted FET_Off) to control the activation and deactivation of the solid-state switch Q23 depending on, e.g., the determined magnitude of the voltage VDC at node N10. For example, during a charging operation to charge the storage capacitor C1, the solid-state switch Q23 is turned off, which allows the solid-state switch Q1 to be turned on and generate charging current to charge the storage capacitor C1. When the voltage detection circuitry 422 determines that magnitude of the voltage VDC at node N10 has reached VDC_max, the voltage detection circuitry 422 generates a control signal to the latch circuitry 424 which, in turn, generates a control signal to turn on the solid-state switch Q23 and thereby discharge C10 to deactivate the solid-state switch Q1 and terminate the charging operation.

Subsequently, when the voltage detection circuitry 422 determines that the magnitude of the voltage VDC at node N10 has dropped to VDC_min (e.g., VDC has dropped to a level at or below VDC_max less V_Hyst), the voltage detection circuitry 422 generates a control signal to the latch circuitry 424 which enables the latch circuitry 424 to generate a control signal to deactivate the solid-state switch Q23, when the latch circuitry 424 is reset by operation of the latch reset circuitry 426. As schematically illustrated in FIG. 4A, the latch reset circuitry 426 comprises an input node that is coupled to the neutral N line (node N18) of the input AC power (i.e., coupled to the second terminal 202). The latch reset circuitry 426 is configured to operate as a neutral negative cycle detector which is configured to determine when $V_{NL}$ is negative, and generate a control signal to the latch circuitry 424 to allow the latch circuitry 424 to generate a control signal to turn off the solid-state switch Q23, and thereby allow a charging operation to be performed. In this regard, the solid-state switch Q23 is always turned off during each neutral negative cycle (i.e., each cycle of the AC input power where $V_{NL}$ is negative).

Figure 5A:
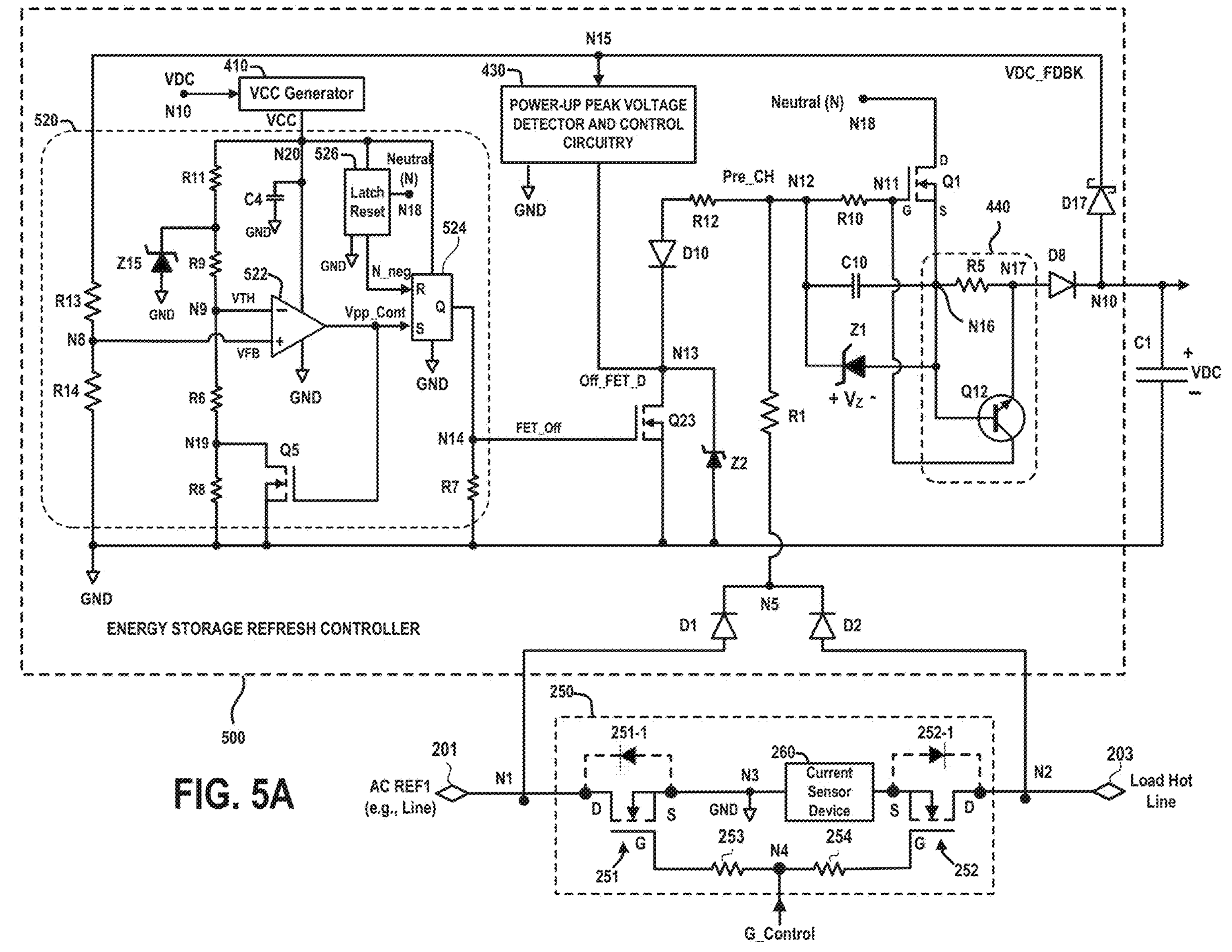
FIGS. 5A and 5B schematically illustrate an energy storage refresh controller, according to another exemplary embodiment of the disclosure.
Figure 5B:
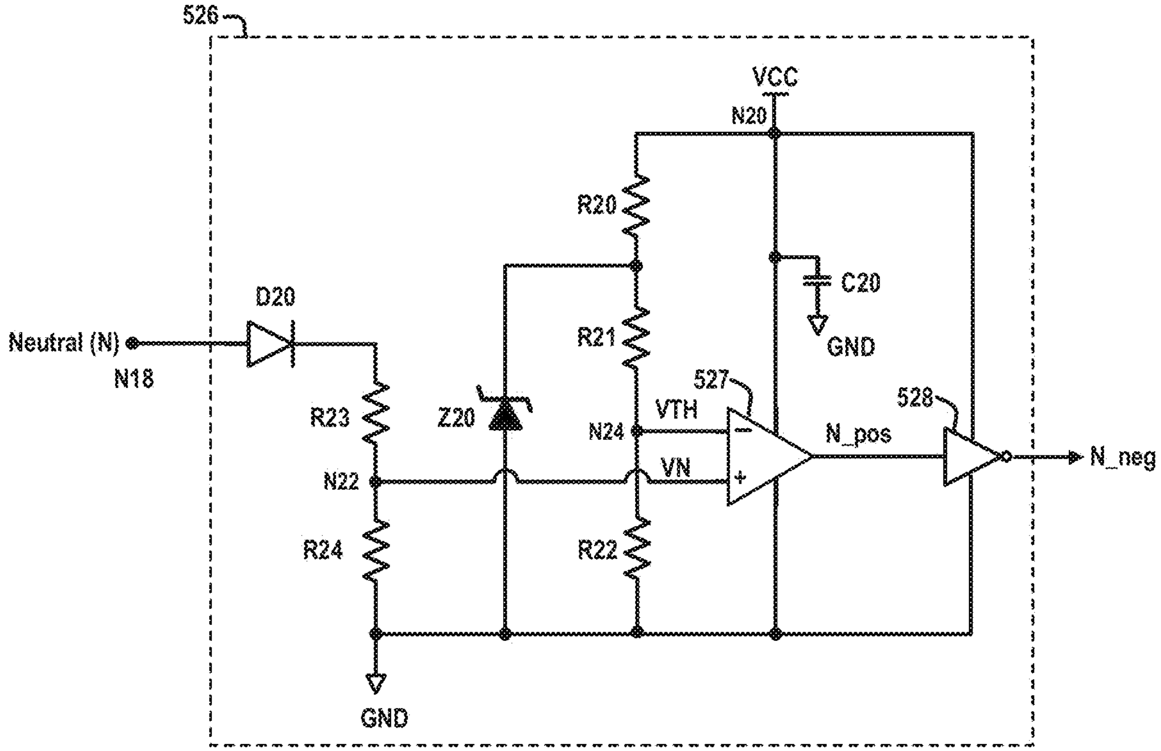
Figure 6:
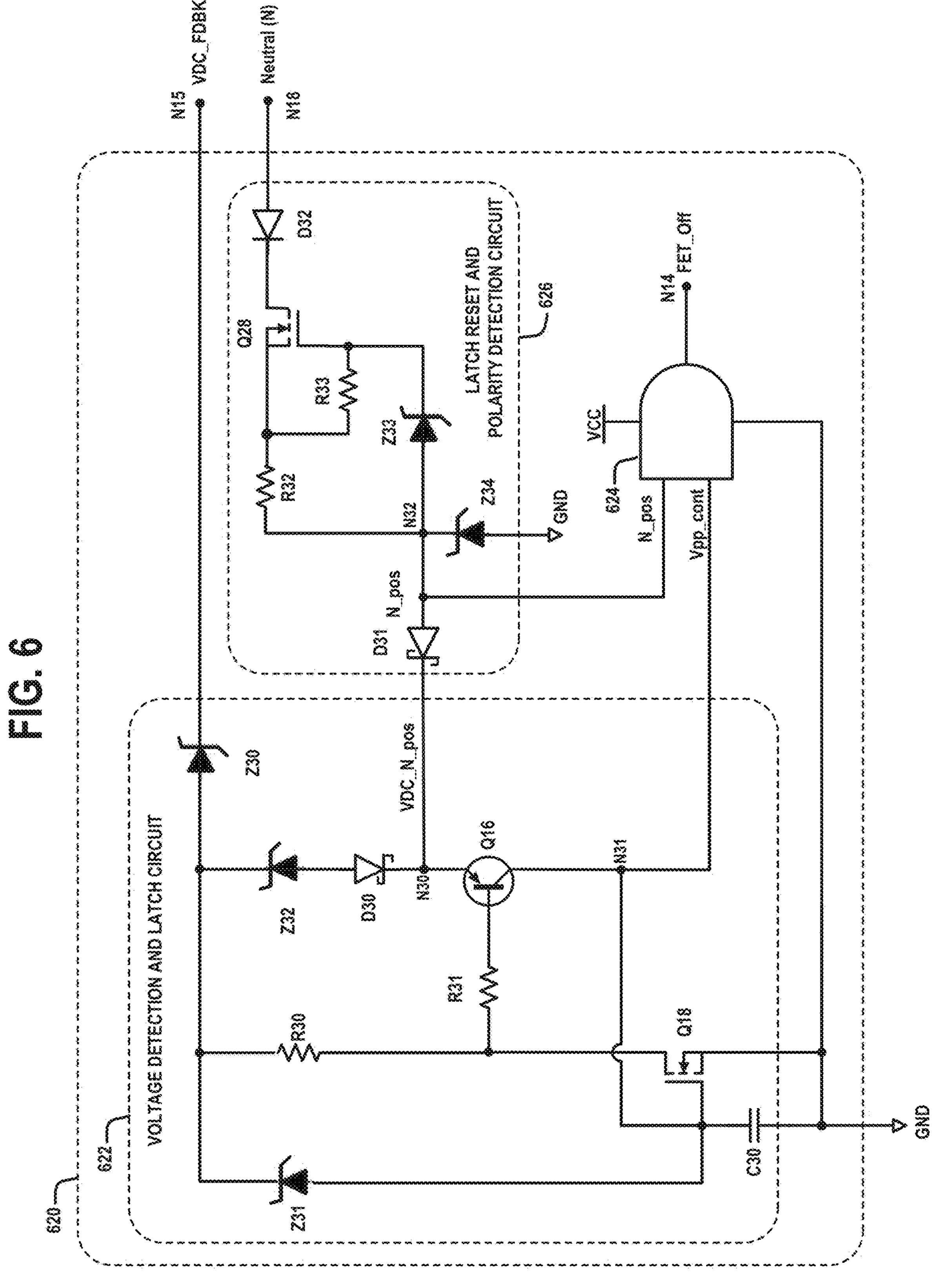
FIG. 6 schematically illustrates a peak voltage detector circuit with hysteresis, which can be implemented in an energy storage refresh controller, according to another exemplary embodiment of the disclosure.

While FIG. 4A depicts a schematic block diagram of the peak voltage detector circuitry 420, it is to be understood that the peak voltage detector circuitry 420 and the constituent circuit blocks 422, 424, and 426 can be implemented using different circuit architectures. For example, as explained in further detail below, FIGS. 5A and 5B are schematic circuit diagrams which illustrate an exemplary implementation of the peak voltage detector circuitry 420 for a 5V logic implementation and source-referenced ground architecture. Moreover, FIG. 6 is a schematic circuit diagram which illustrates another exemplary implementation of the peak voltage detector circuitry 420 for a non-5V logic implementation and source-referenced ground architecture, the details of which will described in further detail below.

In all such embodiments, the peak voltage detector circuitry 420 controls the operation of the solid-state switch Q23 in essentially the same manner to control the charging of the storage capacitor C1, based on the following control protocol. The solid-state switch Q23 is activated (turned on) to cause the capacitor C10 to discharge and thereby deactivate (turn off) the solid-state switch Q1. On the other hand, the solid-state switch Q23 is deactivated (turned off) to allow the capacitor C10 to be charged up to the Zener voltage $V_Z$ of the Zener diode Z1 and thereby self-generate the regulated $V_{GS}$ voltage for driving the solid-state switch Q1 into an activated state (turned on).

In each neutral negative cycle (or positive half-cycle of AC power), the solid-state switch Q23 remains turned off during the entire neutral negative cycle, which allows the capacitor C10 to be charged to the Zener voltage $V_Z$ in each neutral negative cycle (and thereby self-generate the regulated $V_{GS}$ voltage for driving the solid-state switch Q1). At a transition from a neutral negative cycle to a neutral positive cycle (i.e., transition from a positive half-cycle to a negative half-cycle of the AC power), the peak voltage detector circuitry 420 will determine whether or not the voltage VDC at node N10 has decreased below VDC_min (i.e., VDC_max less V_Hyst). If the voltage VDC at node N10 is determined to be greater than VDC_min, at the transition from the neutral negative cycle to the neutral positive cycle, the solid-state switch Q23 will be turned on to immediately discharge the capacitor C10 (and thereby discharge the regulated $V_{GS}$ voltage) so that the solid-state switch Q1 is deactivated, and the storage capacitor C1 is not charged.

On the other hand, if the voltage VDC at node N10 is determined to be less than VDC_min, at the transition from the neutral negative cycle to the neutral positive cycle, the solid-state switch Q23 will remain turned off, so that the solid-state switch Q1 is driven by the regulated $V_{GS}$ voltage (Q1 is activated) to source current to charge the storage capacitor C1 up to VDC_max. In the neutral positive cycle, once the $V_{NL}$ reaches the voltage VDC on node N10, the voltage VDC on node N10 will increase with $V_{NL}$ until VDC_max is reached. At this point, the solid-state switch Q23 is turned on, which causes the capacitor C10 to be discharged (to discharge the $V_{GS}$ voltage) and thereby deactivate the solid-state switch Q1. The solid-state switch Q23 will remain turned on during the remainder of the neutral positive cycle until the transition to the next neutral negative cycle, in which case the solid-state switch Q23 is then turned off to allow the capacitor C10 to be charged to the Zener voltage $V_Z$ (and thereby self-generate the $V_{GS}$ voltage to drive the solid-state switch Q1). In summary, the solid-state switch Q23 is deactivated (turned off) when (i) $V_{NL}$ is negative (neutral negative cycle) or when (ii) the voltage VDC on node N10 is less than VDC_min at a transition from a neutral negative cycle to a neutral positive cycle and VDC is below VDC_max. Otherwise, the solid-state switch Q23 is turned on.

It is to be noted that the diode D10 prevents a large current from flowing from the line L node (node N1) to the neutral N node (N18) during a $V_{NL}$ negative cycle. Without the diode D10, a current path would exist from the line L input (node N1)→through switch 251 (when On)→ground node N→body diode of Q23 (or a body diode of a switch Q24 in the power-up peak voltage detector and control circuitry 430)→R12→Z1→body diode of Q1→neutral N node (N18). Further, the Zener diode Z2 prevents the voltage across the solid-state switch Q23 from reaching the line L voltage during a $V_{NL}$ negative cycle when the first solid-state switch 251 of the solid-state AC switch 250 is turned off. Moreover, the diode D8 prevents the storage capacitor C1 from discharging through the body diode of the solid-state switch Q1 to the neutral N node (N18) when the neutral voltage is less than the voltage VDC at node N10.

The power-up peak voltage detector and control circuitry 430 is configured to control the charging of the storage capacitor C1 upon power-up of the energy storage refresh controller 400 before the VCC generator circuitry 410 generates the internal VCC voltage for sufficient and proper operation of the peak voltage detector circuitry 420. Indeed, since the VCC generator circuitry 410 generates the VCC rail voltage using the output voltage VDC on node N10, this can create a race condition upon start-up of the energy storage refresh controller 400 where the energy storage refresh controller 400 is in an unstable state before the internal voltage VCC is actually generated. In such unstable state, the output voltage VDC on node N10 could increase to a level which is greater than the target maximum voltage VDC_max since the peak voltage detector circuitry 420 is not yet operating in the absence of the VCC operating voltage.

To address this issue, the power-up peak voltage detector and control circuitry 430 is configured to operate during the power-up period to prevent the voltage VDC at the output node N10 from exceeding a voltage VDC_max_power-up which is slighter greater than the voltage VDC_max that the peak voltage detector circuitry 420 controls during normal operation after the VCC voltage has been generated. During power-up, the power-up peak voltage detector and control circuitry 430 monitors the feedback voltage VDC_FDBK to determine the magnitude of the voltage VDC on the output node N10. If the voltage VDC on the output node N10 is determined, during power up, to reach the voltage VDC_max_power-up, a solid-state switch Q24 (FIG. 4C), which is coupled in parallel with the solid-state switch Q23, is turned on to discharge the capacitor C10 and cause the solid-state switch Q1 to turn off and prevent further charging of the storage capacitor C1. An exemplary embodiment of the power-up peak voltage detector and control circuitry 430 will be discussed below in conjunction with FIG. 4C.

The optional current surge protection circuit 440 is an optional circuit that can be implemented in the energy storage refresh controller 400 to protect the storage capacitor C1 from being charged by unwanted current surges. The optional current surge protection circuit 440 operates as follows. When the current flow through the resistor R5 is large enough to generate a voltage drop across the resistor R5 (VR5) which exceeds the threshold turn-on voltage (VBE) of the BJT switch Q12, the switch Q12 will turn on enough to cause a Q1 $V_{GS}$ such that the current is limited to VBE/R5. Even with surge protection implemented in front of the energy storage refresh controller 400 to clamp the AC voltage input, there can still be a relatively large current surge at the clamped voltage level, such that if the solid-state switch Q1 is turned on and sources charging current to the storage capacitor C1, an increase surge in the charging current can occur which, e.g., causes the voltage VDC to spike to a level which is (i) too high for the DC-to-DC conversion circuitry connected to the output node N10, and/or which (ii) exceeds the voltage rating of the storage capacitor C1. The voltage spike is affected by the ESR (equivalent series resistance) of the storage capacitor since $V_{C1}$=Vcap+I×ESR. A capacitor with a small ESR is not affected as much (such as an Aluminum polymer capacitor, for example) but a larger affect can occur when using another type of capacitor, such as an Aluminum Electrolytic, for the storage capacitor C1.

FIG. 4B schematically illustrates VCC generator circuitry, according to an exemplary embodiment of the disclosure.

More specifically, FIG. 4B illustrates an exemplary embodiment of the VCC generator circuitry 410 which can be implemented in the energy storage refresh controller 400 to generate an internal power supply voltage of VCC=5V using the voltage VDC on the output node N10. The VCC generator circuitry 410 comprises a solid-state switch Q18, a diode D16, a resistor R16, a Zener diode Z19, and a capacitor C5. In an exemplary embodiment, the solid-state switch Q18 comprises a depletion mode MOSFET which is normally-on (i.e., in an on-state at zero voltage of gate-to-source ($V_{GS}$)). The diode D16 has an anode terminal coupled to the output node N10 of the energy storage refresh controller 400, and a cathode terminal coupled to a drain terminal of the solid-state switch Q18. The solid-state switch Q18 comprises a source terminal that is coupled to an output node N20. The capacitor C5 is coupled between the node N20 and the ground GND node. The resistor R16 is connected to and between a gate terminal of Q18 and the output node N20. The Zener diode Z18 has a cathode terminal coupled to the gate terminal of Q18 and an anode terminal coupled to the ground GND node.

With this circuit configuration, the VCC generator circuitry 410 generates a VCC voltage on the output node N20 using the voltage VDC on the output node N10 of the energy storage refresh controller 400. The VCC voltage on the output node N20 is essentially set by the Zener voltage of the Zener diode Z19. The solid-state switch Q18 sources current to charge the capacitor C5. As compared to generating the VCC voltage from the AC supply voltage, the VCC generator circuitry 410 saves power because the maximum VDC output, VDC_max, is much lower (e.g., 30V to 70V for example) than the peak line voltage. In addition, the VCC generator circuitry 410 does not require rectification of AC voltage to generate the VCC voltage.

FIG. 4C schematically illustrates a power-up peak voltage detector and control circuit, according to an exemplary embodiment of the disclosure. More specifically, FIG. 4C illustrates an exemplary embodiment of power-up peak voltage detector and control circuitry 430 circuit which can be implemented in the energy storage refresh controller 400 of FIG. 4A. As noted above, since the VCC generator circuitry 410 generates the VCC voltage using the voltage VDC on the output node N10, this can create a race condition upon power-up of the energy storage refresh controller 400 where the energy storage refresh controller 400 is in an unstable state before the internal voltage VCC is actually generated for operating the peak voltage detector circuitry 420. This can result in the voltage VDC on the output node N10 increasing to a level which is significantly greater than VDC_max.

As schematically illustrated in FIG. 4C, the power-up peak voltage detector and control circuitry 430 comprises a Zener diode Z20, a resistor R17, and a solid-state switch Q24. The solid-state switch Q24 comprises an N-type MOSFET having a drain terminal coupled to the node N13, a source terminal coupled to the ground GND node, and a gate terminal coupled to node N21. The Zener diode Z20 comprises a cathode terminal coupled to the feedback node N15 (to input the feedback voltage VDC_FDBK), and an anode terminal coupled to the node N21. The resistor R17 is coupled to and between the node N21 and the ground GND node. In this exemplary embodiment, the solid-state switch Q24 is coupled in parallel with the solid-state switch Q23 of the energy storage refresh controller 400 (see FIG. 4A), since the solid-state switch Q23 is also coupled between the node N13 and the ground GND node.

The power-up peak voltage detector and control circuitry 430 operates as follows. Assume that VDC_max of the energy storage refresh controller 400 is set to, e.g., 60V. In this instance, the Zener diode Z20 and the resistor R17 can be selected such that the total voltage across the Zener diode Z20 and the resistor R17 is set to 65V, wherein the voltage across R17 establishes a threshold $V_{GS}$ to turn on the solid-state switch Q24. During power-up of the energy storage refresh controller 400, if the feedback voltage VDC_FDBK reaches 65V, the solid-state switch Q24 will be turned on, which causes the node N13 to be pulled down to the ground GND reference. When the solid-state switch Q24 is turned on, the capacitor C10 is discharged which causes the solid-state switch Q1 (FIG. 4A) to turn off and prevent further charging of the storage capacitor C1.

In this regard, the power-up peak voltage detector and control circuitry 430 limits the magnitude of the output voltage VDC that is generated on the output node N10 during power-up of the energy storage refresh controller 400 to a value VDC_max_power-up (e.g., 65V) which is slightly greater than the maximum voltage VDC_max that is generated on the output node N10 under control of the peak voltage detector circuitry 420 during normal operation of the energy storage refresh controller 400, subsequent to power-up, after the VCC voltage has been properly generated to operate the peak voltage detector circuitry 420. After the power-up phase, when the proper VCC voltage (e.g., 5V) is generated by the VCC generator circuitry 410, the voltage VDC on the output node N10 will not exceed the prespecified maximum voltage VDC_max. In this case, during normal operation, the feedback voltage VDC_FDBK on the feedback node N15 will not reach VDC_max_power-up (e.g., 65V) and, consequently, the solid-state switch Q24 of the power-up peak voltage detector and control circuitry 430 will not be activated during normal operation.

FIGS. 5A and 5B schematically illustrate an energy storage refresh controller, according to another exemplary embodiment of the disclosure. In particular, FIG. 5A schematically illustrates an energy storage refresh controller 500 (or ERC 500), which is similar to the circuit architecture of the ERC 400 of FIG. 4A, except that FIG. 5A schematically illustrates an exemplary embodiment of a peak voltage detector circuitry with hysteresis 520 for a 5V logic version of the ERC 500. The peak voltage detector circuitry with hysteresis 520 (or peak voltage detector circuitry 520) comprises a comparator 522, a latch circuit 524, a latch reset circuit 526, a solid-state switch Q5, resistors R6, R7, R8, R9, R11, R13 and R14, a Zener diode Z15, and a capacitor C4. An exemplary embodiment of the latch reset circuit 526 is depicted in FIG. 5B.

The comparator 522 comprises (i) a non-inverting (+) input terminal which is coupled to a feedback node (denoted N8) and configured to receive a feedback voltage VFB, (ii) an inverting (−) input terminal which is coupled to threshold voltage node (denoted N9) and configured to receive a threshold voltage VTH, and (iii) an output terminal which is coupled to an input port of the latch circuit 524 and to a gate terminal of the solid-state switch Q5.

In some embodiments, the latch circuit 524 comprises a Set-Reset (SR) latch circuit which comprises a first input port (set S port), a second input port (reset R port), and an output port (Q output port). The set S port is coupled to an output of the comparator 522. The reset R port is coupled to an output of the latch reset circuit 526. The Q output port is coupled to node N14, which is coupled to the gate terminal of the solid-state switch Q23 and the resistor R7. The latch reset circuit 526 comprises an input port that is coupled to the neutral N node (N18), and an output port that is coupled to the reset R port of the latch circuit 524.

As noted above, the VCC generator circuitry 410 is configured to generate an internal supply voltage VCC=5.0 V to power the components of the peak voltage detector circuitry 520. In particular, as schematically illustrated in FIG. 5A, the VCC voltage output (node N20) of the VCC generator circuitry 410 is utilized to provide DC supply power to the comparator 522, the latch circuit 524, and the latch reset circuit 526. In addition, the VCC voltage is used to generate a DC bias current that flows in the path from the VCC output node N20 of the VCC generator circuitry 410 to the ground GND node through the serially connected resistors R11, R9, R6, and R8. The DC bias current causes a threshold voltage VTH to be generated at node N9. As explained in further detail below, the threshold voltage VTH at node N9 will vary depending on whether the solid-state switch Q5 is turned on or turned off. In an exemplary embodiment, the resistors R11, R9, R6, and R8, the Zener diode Z15, and the solid-state switch Q5 collectively implement a DC voltage feedback circuit which is configured to generate a threshold voltage VTH on the threshold voltage node N9 which comprises one of (i) a first threshold voltage which corresponds to the maximum DC voltage (VDC_max), and a second threshold voltage which corresponds to the minimum DC voltage (VDC_min).

The resistors R13 and R14 are serially connected between the feedback node N15 and the ground GND node. The resistors R13 and R14 comprise a resistive voltage divider circuit which is configured to generate a feedback voltage VFB at node N8 which is a fraction of the feedback voltage VDC_FDBK on node N15. In this regard, the feedback voltage VFB on node N8 represents a fraction of the voltage VDC on the output node N10. In an exemplary embodiment, the resistors R13 and R14 collectively implement a DC voltage feedback circuit which is coupled to the output node N10, and which is configured to generate a feedback voltage VFB on the feedback node N8, which corresponds to the DC voltage VDC on the output node N10.

Moreover, the threshold voltage VTH on node N9 represents the voltage VDC_max, when the solid-state switch Q5 is turned off, while the threshold voltage VTH on node N9 represents the voltage VDC_min (VDC_max less V_Hyst) when the solid-state switch Q5 is turned on. In particular, when the solid-state switch Q5 is turned off, the total resistance between node N9 and the ground GND node will be R6+R8. On the other hand, when the solid-state switch Q5 is turned on, the node N19 is essentially pulled down to the ground GND node, thereby shorting out the resistor R8. In this instance, the total resistance between node N9 and the ground GND node is R6, which causes the threshold voltage VTH generated at node N9 to decrease by an amount corresponding to the hysteresis voltage V_Hyst. As such, when the solid-state switch Q5 is turned on, the threshold voltage VTH at node N9 represents the voltage VDC_min (VDC_max less V_Hyst).

During normal operation, the feedback voltage VFB on node N8 is applied to the non-inverting input terminal of the comparator 522, and the threshold voltage VTH on node N9 is applied to the inverting input terminal of the comparator 522. The comparator 522 compares the feedback voltage VFB with the threshold voltage VTH and generates a control signal (denoted Vpp_Cont) based on the comparison. In particular, the output of the comparator 522 will be set to a logic "0" level (i.e., Vpp_Cont="0") when the feedback voltage VFB is less than the threshold voltage VTH. On the other hand, the output of the comparator 522 will be set to a logic "1" level (i.e., Vpp_Cont="1") when the feedback voltage VFB exceeds the threshold voltage VTH.

For example, assume that during a charging operation in which storage capacitor C1 is being charged, the output of the comparator 522 is logic "0" such that the solid-state switch Q5 is turned off. As the storage capacitor C1 is charged by the current sourced from the solid-state switch Q1, the voltage VDC on the output node N10 will increase to VDC_max. When the voltage VDC on the output node N10 reaches VDC_max, the feedback voltage VFB on node N8 will exceed the threshold voltage VTH on node N9, and the comparator 522 will output a logic "1" control signal Vpp_Con. This, in turn causes the solid-state switch Q5 to turn on and pull the node N19 to ground and, thus, reduce the threshold voltage VTH by an amount corresponding to the desired hysteresis voltage V_Hyst (at which time the threshold voltage VTH corresponds to VDC_min). In this state, the control signal output the comparator 522 will remain at a logic "1" level, until the feedback voltage VFB at node N8 decreases to a level that corresponds to VDC_min (VDC_max less V_Hyst). When the feedback voltage VFB falls below the threshold voltage VTH at node N9, the control signal output the comparator 522 will transition from a logic "1" level to a logic "0" level, in which case the solid-state switch Q5 is turned off, and the threshold voltage VTH at node N9 increases back to a level which corresponds to VDC_max.

The latch reset circuit 526 is configured receive as input the neutral N voltage at node N18 and detect whether the neutral N node is in a neutral negative cycle ($V_{NL}$ is negative) or a neutral positive cycle ($V_{NL}$ is positive), and output a control signal (denoted N_neg) which indicates a neutral negative cycle or a neutral positive cycle. For example, in some embodiments, latch reset circuit 526 will output a logic "1" level when the neutral N voltage at node N18 is determined to be in a neutral negative cycle, and output a logic "0" level when the neutral N voltage at node N18 is determined to be a neutral positive cycle.

As noted above, the output (Vpp_Cont) of the comparator 522 controls the set S input of the latch circuit 524, and the output (N_neg) of the latch reset circuit 526 controls the reset R input of the latch circuit 524. The Q output of the latch circuit 524 controls the operation of the solid-state switch Q23. The following truth table illustrates the operation of the SR latch circuit 524:

| S | R | Q (current) | Q (next) | STATE |
|---|---|---|---|---|
| 0 | 0 | 0 | 0 | NC |
| 0 | 0 | 1 | 1 | NC |
| 0 | 1 | 0 | 0 | RESET |
| 0 | 1 | 1 | 0 | RESET |
| 1 | 0 | 0 | 1 | SET |
| 1 | 0 | 1 | 1 | SET |

In a neutral negative cycle ($V_{NL}$ is negative), the control signal output (N_neg) of the latch reset circuit 526 will be at logic "1" level (R=1), in which case the Q output of the latch circuit 524 is reset to logic "0" level ("Reset" state), which causes the solid-state switch Q23 to turn off. With the solid-state switch Q23 turned off, the capacitor C10 can be charged up to the Zener voltage $V_Z$ of the Zener diode Z1 and thereby generate a $V_{GS}$ across the nodes N11 and N16 to turn on the solid-state switch Q1.

Next, in response to a transition from the neutral negative cycle ($V_{NL}$ is negative) to a neutral positive cycle ($V_{NL}$ is positive), the control signal output (N_neg) of the latch reset circuit 526 will transition to a logic "0" level (R=0). At the time of the transition from the neutral negative cycle to the neutral positive cycle, the comparator 522 is comparing the feedback voltage VFB on node N8 with the threshold voltage VTH on node N9 to determine whether the voltage VDC on the output node N10 has dropped below VDC_min (VDC_max less V_Hyst). At this time, if the voltage VDC on the output node N10 has not dropped below VDC_min, the control signal output (Vpp_Con) of the comparator 522 will be at a logic "1" level (S=1), in which case the Q output of the latch circuit 524 is at a logic "1" level ("Set" state). This causes the solid-state switch Q23 to turn on which, in turn, causes the capacitor C10 to be discharged (discharge $V_{GS}$ of Q1) and thereby deactivates the solid-state switch Q1 and prevents the storage capacitor C1 from being charged.

On the other hand, at the time of the transition from the neutral negative cycle to the neutral positive cycle, if the comparator 522 determines that the voltage VDC on the output node N10 has dropped below VDC_min, the control signal output (Vpp_Con) of the comparator 522 will be at a logic "0" level (S=0), in which case the Q output of the latch circuit 524 will remain at a logic "0" level. This causes the solid-state switch Q23 to remain turned off (and prevent discharge of the capacitor C10), and allows the solid-state switch Q1 to remain turned on and source current to recharge the storage capacitor C1 up to VDC_max.

As noted above, in this case, once the positive $V_{NL}$ exceeds the voltage VDC on node N10, the voltage on node N10 will increase until the voltage VDC reaches VDC_max. With the control signal output (Vpp_Con) of the comparator 522 set to the logic "0" level, the solid-state switch Q5 is turned off, which causes the threshold voltage VTH on node N9 to increase back to the level which corresponds to VDC_max. So as the storage capacitor C1 is being charged, the comparator 522 will be able to determine when the feedback voltage VFB on node N8 reaches a level that corresponds to VDC_max, in which case, the comparator 522 will output a control signal (Vpp_Con) with a logic "1" level (S=1). This causes the Q output of the latch circuit 524 to transition to a logic "1" level ("Set" state), in which case the solid-state switch Q23 is turned on to discharge the capacitor C10 and turn off the solid-state switch Q1 to terminate the charging operation. The solid-state switch Q23 will remain turned on for the reminder of the neutral positive cycle until the next transition to the negative neutral cycle.

It is to be noted that once the solid-state switch Q23 is turned on during the neutral positive cycle (i.e., when the solid-state switch Q23 is turned on (i) at the transition from the neutral negative cycle to the neutral positive cycle, if the storage capacitor C1 does not need to be recharged, or (ii) subsequent to the transition from the neutral negative cycle to the neutral positive cycle, after the storage capacitor C1 is recharged to VDC_max), the solid-state switch Q23 will remain turned on during the remainder of the neutral positive cycle, even if the voltage VDC drops below VDC_min during the neutral positive cycle. In particular, the solid-state switch Q23 will remain turned on during the remainder of the neutral positive cycle to prevent the storage capacitor C1 from being charged at a high positive $V_{NL}$ voltage.

For example, in the line-load swap configuration (as shown in FIG. 5A) with diodes D1 and D2 coupled to nodes N1 and N2, respectively, if the solid-state switch Q23 was allowed to be deactivated (turned off) during the neutral positive cycle after the storage capacitor C1 was charged, the capacitor C10 could be charged during the neutral positive cycle due to the following current path: neutral N line→AC switch load (node N2)→diode D2→R1→C10. This is undesired as it can inadvertently cause the solid-state switch Q1 to be activated at high positive $V_{NL}$ voltages, resulting in large current/power spikes charging the storage capacitor C1. This situation could occur if the voltage VDC decreases to less than VDC_min during the neutral positive cycle.

For this reason, the solid-state switch Q23 is only deactivated (turned off) at the transition from the neutral negative cycle to the neutral positive cycle to enable charging of the storage capacitor C1 (if needed), while keeping the solid-state switch Q23 activated (turned on) for the remainder of the neutral positive cycle after the storage capacitor C1 has been charged to VDC_max, or otherwise keeping the solid-state switch Q23 activated (turned on) at the time of the transition from the neutral negative cycle to the neutral positive cycle, if the storage capacitor C1 does not need to be recharged, and for the entirety of the neutral positive cycle. It is to be noted that if the second diode D2 was not present (non-line-load swap architecture), or if the core system was a neutral (N) referenced architecture (as opposed to a common source referenced architecture with the DC ground reference at node N3), then this would not be an issue since there would be no path to charge the capacitor C10 during a neutral positive cycle.

Furthermore, in a neutral (N) referenced architecture, the solid-state switch Q23 would not have to be turned off during a neutral negative cycle, as it does in the current architecture with the DC ground reference at node N3. In a neutral (N) referenced design, the capacitor C10 can be charged through the solid-state switch Q23 or a body diode of the solid-state switch Q23 during a neutral negative cycle. On the other, as noted above, in the common source referenced architecture with the DC ground reference at node N3 (such as shown in FIG. 5A), if the solid-state switch Q23 is turned on, it will not allow the capacitor C10 to charge during a neutral negative cycle. This is because if the load connected to node N2 of the AC switch 250 has a low resistance, then resistor R12 can be put in parallel with Zener diode Z1 and not enough current flows into the capacitor C10. If the solid-state switch Q23 is not turned off during a neutral negative cycle, then there are two current paths that exist: (i) a first current path which comprises the line L input (node N1)→diode D1→R1→R12→diode D10→Q23→current sense resistor 260→body diode 252-1→load connected to node N2→neutral N line; and (ii) a second current path which comprises the line L input (node N1)→diode D1→R1→Zener diode Z1→body diode of Q1→neutral N line. The first current path will prevent the charging of the capacitor C10 so the solid-state switch Q23 must be turned off during each neutral negative cycle.

It is to be appreciated that under low load conditions, it may take multiple AC power cycles before the voltage VDC on the output node N10 drops below VDC_min (VDC_max less V_Hyst). In this case, the solid-state switch Q23 is turned on during each neutral positive cycle of the multiple AC power cycles, to prevent the storage capacitor C1 from being charged. In other words, at light load conditions, the storage capacitor C1 is not charged every cycle, which improves efficiency at low loads. It is to be noted, however, that there is a balance between the magnitude of the hysteresis voltage V_Hyst to be set, and the optimal efficiency at light load conditions. If the Hysteresis value is set too large, then a larger storage capacitor C1 or higher VDC_max voltage is needed because the storage capacitor C1 must be able to provide sufficient energy from the minimum voltage threshold VDC_min (VDC_max less V_Hyst) to a smallest (minimum) allowed VDC voltage output (which is less than the VDC_min threshold) required for the DC-to-DC converters, for at least a full cycle plus the time to the smallest (minimum) allowed VDC output voltage. This is because the VDC output might be just above or equal to the minimum threshold VDC_min (VDC_max less V_Hyst) at the time of the transition from a neutral negative cycle to a neutral positive cycle.

For example, assume that VDC_max is 60V and that V_Hyst is 2V. In this case, the threshold VDC_min is 58V. Assume further that the smallest allowed VDC output voltage is 10V. In this case, the storage capacitor must be able to provide sufficient energy (charge) to the DC-to-DC converter circuitry over the range of 58V to 10V. If V_Hyst is set to 10 V (keeping the other values the same), the storage capacitor must be able to provide sufficient energy (charge) to the DC-to-DC converter circuitry over the range of 50V to 10V, thereby providing the same amount of power over a smaller voltage range. As such, the storage capacitor would need to be increased in size, or VDC_max would need to be increased.

FIG. 5B schematically illustrates a latch reset circuit, according to an exemplary embodiment of the disclosure. More specifically, FIG. 5B schematically illustrates an exemplary embodiment of the latch reset circuit 526 of the peak voltage detector circuitry 520 of FIG. 5A. The latch reset circuit 526 comprises a comparator 527, an inverter 528, a diode D20, a Zener diode Z20, a capacitor C20, and resistors R20, R21, R22, R23, and R24. The comparator 527 comprises (i) a non-inverting (+) input terminal that is coupled to a neutral N voltage sense node (N22) and configured to receive a voltage VN generated at node N22, (ii) an inverting (−) input terminal which is coupled to threshold voltage node (N24) and configured to receive a threshold voltage VTH, and (iii) an output terminal which is coupled to an input port of the inverter 528. In some embodiments, the inverter 528 comprises a CMOS inverter circuit.

The VCC voltage at node N20 is applied to the comparator 527 and the inverter 528 to provide DC supply voltage for operating the comparator 527 and the inverter 528. In addition, the VCC voltage is used to generate a DC bias current that flows in the path from the VCC output node N20 to the ground GND node through the serially connected resistors R20, R21, and R22. The DC bias current causes a threshold voltage VTH to be generated at node N24.

The latch reset circuit 526 comprises an input port coupled to the neutral N node N18. The diode D20 has an anode terminal coupled to the neutral N node N18, and a cathode terminal coupled to a resistive voltage divider circuit comprising the resistors R23 and R24, which are serially connected between the cathode terminal of D20 and the ground GND node. The resistive voltage divider circuit is configured to generate a sense voltage VN on the node N22 which is a fraction of the neutral line voltage during a neutral positive cycle.

The latch reset circuit 526 is configured to output a control signal N_neg at the output of the inverter 528, wherein the control signal N_neg has a logic "1" level when $V_{NL}$ at node N18 is negative, and wherein the control signal N_neg has a logic "0" level when $V_{NL}$ at node N18 is positive. In particular, when $V_{NL}$ at node N18 is positive, the diode D20 will be forward biased, and a sense voltage VN will be generated at node N22. In response to the sense voltage VN (where VN>VTH), the comparator will output a control signal N_pos with a logic "1" level, which causes the inverter 528 to output the control signal N_neg with a logic "0" level, thereby indicating the $V_{NL}$ at node N18 is positive. On the other hand, when $V_{NL}$ at node N18 is negative, the diode D20 will be reverse biased, and a voltage of essentially 0V will be present on node N22. In response to the VN=0V (where VN<VTH), the comparator will output a control signal N_pos with a logic "0" level, which causes the inverter 528 to output the control signal N_neg with a logic "1" level, thereby indicating the $V_{NL}$ at node N18 is negative.

FIG. 6 schematically illustrates a peak voltage detector circuit, according to another exemplary embodiment of the disclosure. In particular, FIG. 6 schematically illustrates an exemplary embodiment of peak voltage detector circuitry with hysteresis 620 (or peak voltage detector circuitry 620) which can be utilized to implement the peak voltage detector circuitry with hysteresis 420 in the energy storage refresh controller 400 of FIG. 4A, according to another exemplary embodiment of the disclosure. The peak voltage detector circuitry 620 comprises a non-5V logic architecture which provides increased immunity to noise/transients of the AC power supply. In this architecture, the VCC generator circuitry (e.g., VCC generator 410, FIG. 4A) is configured to generate a supply voltage of VCC=16V, which can decrease to a voltage of 5V while enabling proper operation of the DC powered circuitry of the peak voltage detector circuitry 620. For example, the VCC supply voltage can fluctuate as a triangular-shaped DC voltage which fluctuates between 16V and 5V, while enabling proper operation.

The peak voltage detector circuitry 620 comprises a voltage detection and latch circuit 622, an AND circuit 624, and a latch reset and polarity detection circuit 626. The voltage detection and latch circuit 622 performs functions which are similar to the voltage detection and latch circuitry discussed above. For example, the voltage detection and latch circuit 622 performs functions that are similar to the voltage comparator 522 with hysteresis and the latch circuit 524 (FIG. 5A) as discussed above. The AND circuit 624 is configured to generate a control signal on node N14 to control the operation of the solid-state switch Q23 (FIGS. 4A and 5A) in the same manner as discussed above. The latch reset and polarity detection circuit 626 is configured to detect a polarity of $V_{NL}$ and output a control signal (denoted N_pos) which is applied to one input of the AND circuit 624.

The voltage detection and latch circuit 622 comprises Zener diodes Z30, Z31, and Z32, diode D30 (e.g., Schottky diode), resistors R30 and R31, a capacitor C30, and solid-state switches Q16 (e.g., PNP BJT) and Q18 (n-type MOSFET). The latch reset and polarity detection circuit 626 comprises diodes D31 (e.g., Schottky diode) and D32, Zener diodes Z33 and Z34, resistors R32 and R33, and a solid-state switch Q28. The latch reset and polarity detection circuit 626 comprises (i) an input terminal which is coupled to the neutral N node N18, (ii) a first output terminal (e.g., cathode terminal of diode D31) which is coupled to node N30 of the voltage detection and latch circuit 622, and (ii) a second output terminal node N32. The AND circuit comprises (i) a first input terminal that is coupled to output node N31 of the voltage detection and latch circuit 622 and configured to receive a control signal Vpp_cont, (ii) a second input terminal that is coupled to the node N32 of the latch reset and polarity detection circuit 626 and configured to receive a control signal N_pos, and (iii) an output terminal that is coupled to node N14 (i.e., the gate terminal of the solid-state switch Q23 (FIGS. 4A and 5A).

The voltage detection and latch circuit 622 comprises an input port (cathode of Zener diode Z30) which is coupled to the feedback node N15 and configured to receive the feedback voltage VDC_FDBK which represents the voltage VDC on the output node N10 of the energy storage refresh controller, as discussed above. The voltage detection and latch circuit 622 implements the Zener diodes Z30 and Z31 for voltage detection. In this configuration, the Zener voltages of Zener diodes Z30 and Z31 plus $V_{GS}$ of the solid-state switch Q18 correspond to VDC_max (peak voltage).

The solid-state switches Q16 and Q18 form a latch. When the solid-state switch Q18 turns on, the solid-state switch Q16 turns on, and the output voltage at node N31 (collector of Q16) is fed back to the gate terminal of the solid-state switch Q18, which causes the solid-state switch Q18 to be latched on. The hysteresis is generated by the Zener voltages of Zener diodes Z30 and Z32, which is less than the Zener voltages of Z30 and Z31. In this regard, the hysteresis is the difference between the Zener voltage of Z31 and the Zener voltage of Z32. For example, if the Zener voltage of Z31 is 20V, and the Zener voltage of Z32 is 16V, the hysteresis V_Hyst is 4V.

The latch reset and polarity detection circuit 626 operates as a neutral polarity detection circuit to determine if $V_{NL}$ at node N18 is negative or positive, and generates a control voltage N_pos based on the detected polarity. The connection of the diode D31 between nodes N30 and N32 is configured to keep the control voltage Vpp_cont at node N31 at a logic "1" level until a neutral negative cycle even if the voltage VDC on the output node N10 of the ERC has dropped to the minimum threshold VDC_min (VDC_max less V_Hyst). This prevents the storage capacitor C1 from being charged at a time when the positive $V_{NL}$ voltage is high (e.g., at peak voltage). Normally, the latch would shut off when VDC_min was reached. However, it is not desirable for the latch to turn off during a neutral positive cycle, as this would allow the solid-state switch Q1 of the ERC to turn back on and charge the storage capacitor CL. As such, the circuitry is configured to turn off the latch circuit when the $V_{NL}$ voltage transitions to a neutral negative cycle.

The AND circuit 624 receives the control signals N_pos and Vpp_cont, and generates a control signal FET_Off at node N14 to control the activation and deactivation of the solid-state switch Q23 using the same logic for ON/OFF control of Q23 as discussed above. The control signal Vpp_cont latches to a logic "1" level when the voltage VDC reaches VDC_max, and is reset to a logic "0" level when (i) the voltage VDC on the output node N10 of the ERC decreases to the minimum threshold voltage VDC_min and (ii) $V_{NL}$ is in a neutral negative cycle. When $V_{NL}$ is positive and the voltage VDC has reached VDC_max, then both control signal inputs to the AND circuit 624 will be at logic "1" levels, which causes the AND circuit 624 to output a control signal FET_off with a logic "1" level to activate (turn on) the solid-state switch Q23 and, thus, deactivate the solid-state switch Q1. Whenever $V_{NL}$ is negative, the control signal N_pos will be at a logic "0" level, which causes the AND circuit 624 to output a control signal FET_off with a logic "0" level to deactivate (turn off) the solid-state switch Q23 and thereby allow the solid-state switch Q1 to charge the storage capacitor C1, as discussed above.

It is to be noted that the VCC generator circuitry 410 shown in FIG. 4B can be utilized to generate the internal VCC voltage to operate the AND circuit 624. However, when utilized in conjunction with the exemplary embodiment of FIG. 6, the VCC generator circuitry 410 is slightly modified for a non-5V logic architecture to generate a VCC of, e.g., 15V, 16V etc., which can drop to 5V, to provide more margin than the 5V logic architecture discussed above. For example, in the VCC generator circuitry 410 of FIG. 4B, the capacitor C5 can be smaller, in which case VCC will resemble a triangle wave, the AND circuit 624 will still function properly. The AND circuit 624 can be implemented with high voltage transistors, which makes the design more noise immune since these circuit components can operate over larger voltage ranges.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, and to enable others of ordinary skill in the art to understand the embodiments disclosed herein.

What is claimed is:

1. A device, comprising:

a solid-state alternating current (AC) switch comprising a first solid-state switch and a second solid-state switch which are coupled back-to-back to a common node of the solid-state AC switch;

a power converter circuit coupled to the common node of the solid-state AC switch and configured to convert an AC voltage to a direct current (DC) voltage, wherein the common node of the solid-state AC switch is utilized as a DC ground node of the power converter circuit, and wherein the DC voltage output from the power converter circuit is ground referenced to the common node of the solid-state AC switch; and DC-to-DC conversion circuitry configured to convert the DC voltage, which is generated by the power converter circuit, into one or more DC supply voltages that are ground referenced to the common node of the solid-state AC switch.

2. The device of claim 1, further comprising control circuitry which is configured to control the solid-state AC switch, wherein the DC voltage output from the power converter circuit is utilized to provide DC power to the control circuitry, and wherein the common node of the solid-state AC switch is utilized as a DC ground node of the control circuitry.

3. The device of claim 2, wherein the control circuitry comprises a switch driver circuit that is configured to drive the solid-state AC switch with a control voltage that is ground referenced to the common node of the solid-state AC switch.

4. The device of claim 2, further comprising a current sensor device disposed in an electrical path between the first solid-state switch and the second solid-state switch, wherein the control circuitry is configured to process current sensor signals from the current sensor device to determine a magnitude of current flow through the solid-state AC switch.

5. The device of claim 2, further comprising an AC voltage measurement circuit comprising a DC ground node coupled to the common node of the solid-state AC switch, and at least one power input terminal coupled to at least one of a line side and a load side of the solid-state AC switch, wherein the AC voltage measurement circuit is configured to measure the AC voltage at one of the line side and the load side of the solid-state AC switch.

6. The device of claim 1, wherein the first solid-state switch and the second solid-state switch each comprise a MOSFET device, wherein the common node of the solid-state AC switch comprises a common source connection of the first and second solid-state switches.

7. The device of claim 1, wherein the power converter circuit comprises a first power input terminal that is coupled to a line side of the solid-state AC switch, and a second power input terminal that is coupled to load side of the solid-state AC switch.

8. The device of claim 1, wherein the power converter circuit is configured to convert the AC voltage to the DC voltage by utilizing current drawn from AC supply power to charge a storage capacitor to a maximum DC voltage.

9. The device of claim 1, wherein the device comprises an intelligent circuit breaker device.

10. The device of claim 1, wherein the device comprises an intelligent dimmer switch device.

11. A device, comprising:

a solid-state alternating current (AC) switch comprising a first solid-state switch and a second solid-state switch which are coupled back-to-back to a common node of the solid-state AC switch; and a power converter circuit coupled to the common node of the solid-state AC switch and configured to convert an AC voltage to a direct current (DC) voltage, wherein the common node of the solid-state AC switch is utilized as a DC ground node of the power converter circuit, and wherein the DC voltage output from the power converter circuit is ground referenced to the common node of the solid-state AC switch;

wherein the power converter circuit is configured to convert the AC voltage to the DC voltage by utilizing current drawn from AC supply power to charge a storage capacitor to a maximum DC voltage; and wherein the power converter circuit comprises a peak voltage detection circuit which is configured to monitor the voltage across the storage capacitor and (i) generate a control signal to terminate a charging operation when the voltage across the storage capacitor is determined to reach the maximum DC voltage, and to generate a control signal to initiate a charging operation to recharge the storage capacitor when the voltage across the storage capacitor is determined to drop below a minimum threshold DC voltage.

12. The device of claim 11, further comprising:

control circuitry which is configured to control the solid-state AC switch, wherein the DC voltage output from the power converter circuit is utilized to provide DC power to the control circuitry, and wherein the common node of the solid-state AC switch is utilized as a DC ground node of the control circuitry;

wherein the control circuitry comprises a switch driver circuit that is configured to drive the solid-state AC switch with a control voltage that is ground referenced to the common node of the solid-state AC switch.

13. A power converter circuit, comprising:

a first terminal and a second terminal configured to couple to an alternating current (AC) power source which provides AC power;

a storage capacitor coupled to and between an output node of the power converter circuit and a direct current (DC) ground node;

a first solid-state switch disposed in an electrical path between the second terminal and the output node; and control circuitry configured to control an operation of the first solid-state switch for sourcing a charging current from the AC power, which flows from the second terminal to the output node, to charge the storage capacitor and generate a DC voltage at the output node, wherein the control circuitry is configured to:

monitor a DC voltage at the output node;

determine an occurrence of a transition to a negative half-cycle of the AC power; and in response to determining the occurrence of the transition to the negative half-cycle of the AC power:

cause the first solid-state switch to be deactivated to disable the sourcing of the charging current to the output node, in response to determining that the monitored DC voltage at the output node is at a maximum DC voltage or greater than a minimum DC voltage; and cause the first solid-state switch to be activated to enable the sourcing of the charging current to the output node to charge the storage capacitor to the maximum DC voltage, in response to determining that the monitored DC voltage at the output node is at or below the minimum DC voltage.

14. The power converter circuit of claim 13, wherein the control circuitry is further configured to cause the first solid-state switch to be deactivated to disable the sourcing of the charging current to the output node during a remaining portion of the negative half-cycle, in response to determining that the storage capacitor is charged back up to the maximum DC voltage.

15. The power converter circuit of claim 13, wherein the first terminal is configured for coupling to a phase line of the AC power source, and the second terminal is configured for coupling to a neutral line of the AC power source.

16. The power converter circuit of claim 13, further comprising:

a driver circuit configured to utilize current drawn from the AC power source during positive half-cycles of the AC power to generate a regulated control voltage for driving the first solid-state switch; and a second solid-state switch coupled to and between the driver circuit and the DC ground node, and comprising a control terminal coupled to the control circuitry;

wherein the control circuitry configured to control an operation of the first solid-state switch by (i) deactivating the second solid-state switch to enable the driver circuit to generate the regulated control voltage for driving the first solid-state switch, and (i) activating the second solid-state switch to prevent the driver circuit from generating the regulated control voltage and thereby deactivate the first solid-state switch.

17. The power converter circuit of claim 16, wherein the control circuitry comprises a peak voltage detection circuit with a hysteresis voltage, wherein the hysteresis voltage corresponds to a difference between the maximum DC voltage and the minimum DC voltage.

18. The power converter circuit of claim 17, wherein the peak voltage detection circuit comprises:

a voltage detector circuit, a latch circuit, and a latch reset circuit;

wherein the voltage detector circuit is configured to monitor the DC voltage at the output node and generate a first control signal that is applied to a first input terminal of the latch circuit, wherein the first control signal comprises a first logic level to indicate that the monitored DC voltage is at the maximum DC voltage, and a second logic level to indicate that the monitored DC voltage is below the minimum DC voltage;

wherein the latch reset circuit is configured to monitor a phase of the AC power, and generate a second control signal that is applied to a second input terminal of the latch circuit, wherein the second control signal comprises a first logic level to indicate that the monitored phase of the AC power is in a positive-half cycle of the AC power, and a second logic level to indicate that the monitored phase of the AC power is in a negative half-cycle of the AC power; and wherein the latch circuit is configured to generate and output a third control signal to control the operation of the second solid-state switch, based on logic levels of the first and second control signals.

19. The power converter circuit of claim 18, wherein the latch circuit generates the third control signal to cause the second solid-state switch to be one of: (i) deactivated during an entirety of each positive-half cycle of the AC power; (ii) activated at a beginning portion of a given negative half-cycle of the AC power when the monitored DC voltage is greater than the minimum DC voltage; and (iii) deactivated at a beginning of the given negative half-cycle of the AC power when the monitored DC voltage is below the minimum DC voltage and then activated for a remaining portion of the given negative half-cycle after the monitored DC voltage reaches the maximum DC voltage.

20. The power converter circuit of claim 18, wherein:

the voltage detector circuit comprises a DC voltage feedback circuit, a threshold voltage generator circuit, and a comparator;

the comparator comprises a first input terminal coupled to a feedback node of the DC voltage feedback circuit, a second input terminal coupled to a threshold voltage node of the threshold voltage generator circuit, and an output terminal cooled the first input terminal of the latch circuit;

the DC voltage feedback circuit is coupled to the output node and configured to generate a feedback voltage on the feedback node, which corresponds to the DC voltage on the output node;

the threshold voltage generator circuit is configured to generate a threshold voltage on the threshold voltage node which comprises one of (i) a first threshold voltage which corresponds to the maximum DC voltage, and a second threshold voltage which corresponds to the minimum DC voltage; and the comparator is configured to compare the feedback voltage and the threshold voltage, and generate the first control signal based on the comparison, which is applied to a first input terminal of the latch circuit.

* * * * *